United States Patent
Yamamoto et al.

(10) Patent No.: US 9,543,295 B2
(45) Date of Patent: Jan. 10, 2017

(54) SEMICONDUCTOR DEVICE

(71) Applicant: Semiconductor Energy Laboratory Co., Ltd., Atsugi-shi, Kanagawa-ken (JP)

(72) Inventors: Yoshitaka Yamamoto, Nara (JP); Masayuki Sakakura, Kanagawa (JP); Tetsuhiro Tanaka, Kanagawa (JP); Daisuke Matsubayashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/841,773

(22) Filed: Sep. 1, 2015

(65) Prior Publication Data

US 2016/0071840 A1     Mar. 10, 2016

(30) Foreign Application Priority Data

Sep. 4, 2014   (JP) ................................. 2014-179836

(51) Int. Cl.
  *H01L 27/07*    (2006.01)
  *H01L 29/786*   (2006.01)
  (Continued)

(52) U.S. Cl.
  CPC ....... *H01L 27/0688* (2013.01); *H01L 21/8258* (2013.01); *H01L 23/5223* (2013.01);
  (Continued)

(58) Field of Classification Search
  CPC ........... H01L 21/28273; H01L 23/5223; H01L 27/10855; H01L 27/1225; H01L 27/124; H01L 27/1251; H01L 27/14614; H01L 29/41733; H01L 29/786; H01L 29/7869
  See application file for complete search history.

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP   1737044 A   12/2006
EP   2226847 A    9/2010
(Continued)

OTHER PUBLICATIONS

N. Kimizuka, and T. Mohri, Journal of Solid State Chemistry, vol. 60, 1985, pp. 382-384.
(Continued)

*Primary Examiner* — Pamela E Perkins
(74) *Attorney, Agent, or Firm* — Fish & Richardson P.C.

(57) ABSTRACT

A semiconductor device that includes transistors with different threshold voltages is provided. Alternatively, a semiconductor device including a plurality of kinds of circuits and transistors whose electrical characteristics are different between the circuits is provided. The semiconductor device includes a first transistor and a second transistor. The first transistor includes an oxide semiconductor, a conductor, a first insulator, a second insulator, and a third insulator. The conductor has a region where the conductor and the oxide semiconductor overlap with each other. The first insulator is positioned between the conductor and the oxide semiconductor. The second insulator is positioned between the conductor and the first insulator. The third insulator is positioned between the conductor and the second insulator. The second insulator has a negatively charged region.

20 Claims, 25 Drawing Sheets

(51) Int. Cl.
  *H01L 27/06* (2006.01)
  *H01L 49/02* (2006.01)
  *H01L 23/522* (2006.01)
  *H01L 27/115* (2006.01)
  *H01L 21/8258* (2006.01)

(52) U.S. Cl.
  CPC .......... *H01L 27/1156* (2013.01); *H01L 28/40* (2013.01); *H01L 29/7869* (2013.01); *H01L 2924/0002* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,521,309 B2 | 4/2009 | Kaneko et al. |
| 7,674,650 B2 | 3/2010 | Akimoto et al. |
| 7,732,819 B2 | 6/2010 | Akimoto et al. |
| 7,795,096 B2 | 9/2010 | Wang |
| 8,378,341 B2 | 2/2013 | Hayashi et al. |
| 8,432,730 B2 | 4/2013 | Uochi et al. |
| 8,547,771 B2 | 10/2013 | Koyama |
| 8,848,464 B2 | 9/2014 | Sekine et al. |
| 8,957,889 B2 | 2/2015 | Miyake |
| 8,975,709 B2 | 3/2015 | Miyake |
| 9,129,937 B2 | 9/2015 | Hayashi et al. |
| 9,312,394 B2 | 4/2016 | Hayashi et al. |
| 9,331,210 B2 | 5/2016 | Takemura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0034023 A1* | 2/2010 | Shingu et al. .... H01L 21/28282 365/185.18 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0056175 A1 | 3/2012 | Takemura |
| 2015/0011048 A1 | 1/2015 | Tanaka et al. |
| 2015/0024577 A1 | 1/2015 | Kato et al. |
| 2015/0041801 A1 | 2/2015 | Yamazaki et al. |
| 2015/0041802 A1 | 2/2015 | Yamazaki |
| 2015/0060846 A1 | 3/2015 | Yamamoto et al. |
| 2015/0069387 A1 | 3/2015 | Yamamoto et al. |
| 2015/0171115 A1 | 6/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | H11/505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012/257187 | 12/2012 |

(56) References Cited

FOREIGN PATENT DOCUMENTS

| JP | 2013/247143 | 12/2013 |
|---|---|---|
| WO | WO-2004/114391 | 12/2004 |

OTHER PUBLICATIONS

Kimizuka, M. Isobe, and M. Nakamura, Journal of Solid State Chemistry, vol. 116, 1995, pp. 170-178.

S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, Journal of the Society for Information Diplay, vol. 22, Issue 1, 2014, pp. 55-67.

S. Yamazaki, T. Atsumi, K. Dairiki, K. Okazaki, and N. Kimizuka, ECS Journal of Solid State Science and Technology, vol. 3, Issue 9, 2014, pp. Q3012-Q3022.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technolgy", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transctions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID Internaional Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM—FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM—FPD '09 Digest of Technical papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Diaplay), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technocal Papaers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Applicaiton", SID Digest '07 : SID Internaional Symposium Digest of Technical Papers, 2007, vol. 38, pp. 1737-1740.

Kikuchi.H et al., "Polymer-Stablized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 208, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceddings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Symthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness Probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Cyrstalline Transparent Oxide Semiconductor", Science, May 23, 2003, vol. 300, No. 5623, pp. 1269-1272

Nowatari.H et al., "650.2: Intermediate Connector With Suppressed Voltage Loss for White Tandem OLEDs", SID Digest '09 : SID International Symposium Digest of Technical papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Didgest Technical papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZn04", Phys. Rev. B (Physical Review, B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical papers, May 31, 2009, pp. 184-187.

Osada. T et al., "Development of Driver-Integrated Panel using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Diesgt '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using. Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amprphous GIZO (Ga2O3—In2O3—ZnO) TFT", SID Digest '08 ; SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings fo the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Ai2O3 Gate Insulator", Appl. Phys. Lett. (Applied Physics Letters), Sep. 1, 2003, vol. 83,No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

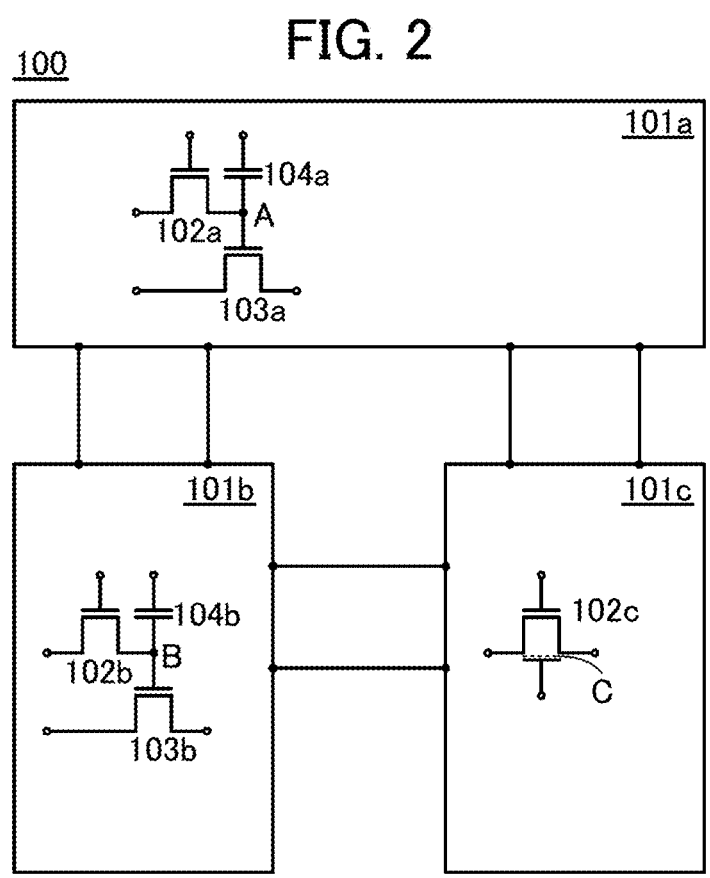

FIG. 22A
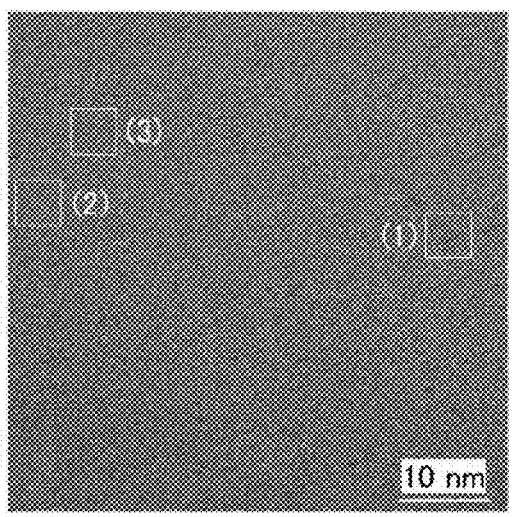
FIG. 22B  FIG. 22C  FIG. 22D
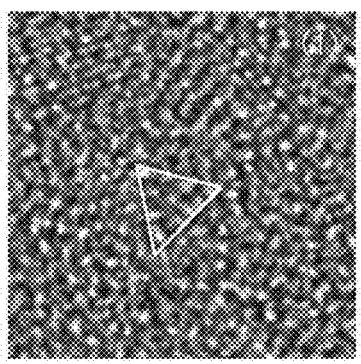 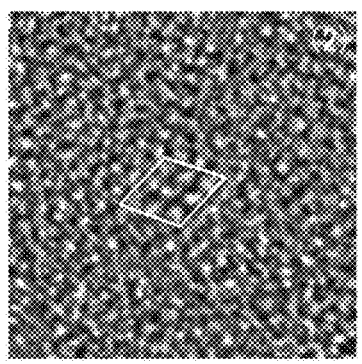 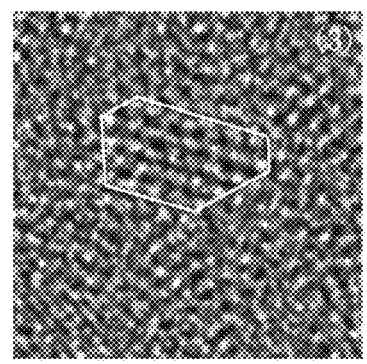

FIG. 24A
FIG. 24B
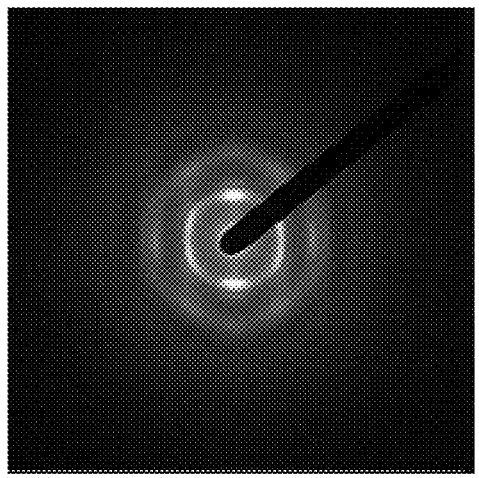
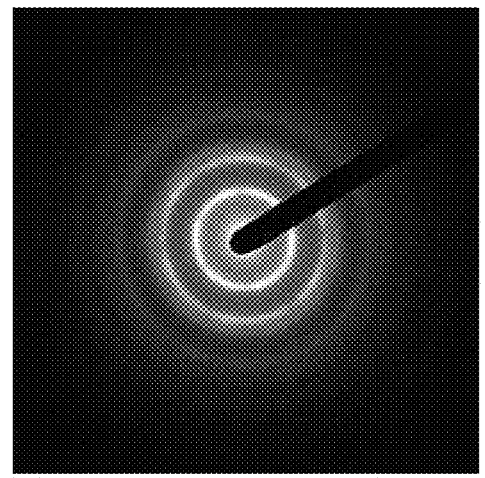

SEMICONDUCTOR DEVICE

BACKGROUND OF THE INVENTION

1. Field of the Invention

The present invention relates to, for example, a semiconductor, a transistor, and a semiconductor device. The present invention relates to, for example, a method for manufacturing a semiconductor, a transistor, and a semiconductor device. The present invention relates to, for example, a semiconductor, a display device, a light-emitting device, a lighting device, a power storage device, a memory device, a processor, and an electronic device. The present invention relates to a method for manufacturing a semiconductor, a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

As silicon which is used as a semiconductor of a transistor, either amorphous silicon or polycrystalline silicon is used depending on the purpose. For example, for a transistor included in a large display device, it is preferable to use amorphous silicon, which can be used to form a film on a large substrate with the established technique. For a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed. The transistors including oxide semiconductors have different features from the transistors including amorphous silicon or polycrystalline silicon. For example, a display device to which a transistor including an oxide semiconductor is applied is known to have small power consumption.

It is known that a transistor including an oxide semiconductor has an extremely low leakage current in an off state. For example, a low-power-consumption CPU utilizing a characteristic of low leakage current of the transistor including an oxide semiconductor is disclosed (see Patent Document 1).

For reduction of power consumption by power gating, the transistor including an oxide semiconductor preferably has normally-off electrical characteristics. As a method for making the transistor including an oxide semiconductor have normally-off electrical characteristics by controlling the threshold voltage of the transistor, Patent Document 2 discloses a method in which a floating gate is provided in a region overlapping with the oxide semiconductor and a negative fixed charge is injected into the floating gate.

An oxide semiconductor film can be formed by a sputtering method or the like, and thus can be used in a transistor included in a large display device. Because a transistor including an oxide semiconductor has high field-effect mobility, a high-performance display device in which a driver circuit and a pixel circuit are formed over the same substrate can be obtained. In addition, there is an advantage that capital investment can be reduced because part of production equipment for a transistor including amorphous silicon or a transistor including polycrystalline silicon can be retrofitted and utilized.

Oxide semiconductors have a long history, and in 1985, synthesis of an In—Ga—Zn oxide crystal was reported (see Non-Patent Document 1). Further, in 1995, it was reported that an In—Ga—Zn oxide has a homologous structure and is represented by a composition formula $InGaO_3(ZnO)_m$ (m is a natural number) (see Non-Patent Document 2).

In 1995, a transistor including an oxide semiconductor was invented, and its electrical characteristics were disclosed (see Patent Document 3).

In 2014, transistors including a crystalline oxide semiconductor were reported (see Non-Patent Documents 3 and 4). The transistors in these reports include a c-axis aligned crystalline oxide semiconductor (CAAC-OS) and thus are capable of mass-production and have high electrical characteristics and reliability.

REFERENCE

Patent Document

[Patent Document 1] Japanese Published Patent Application No. 2012-257187
[Patent Document 2] Japanese Published Patent Application No. 2013-247143
[Patent Document 3] Japanese Translation of PCT International Application No. H11-505377

Non-Patent Document

[Non-Patent Document 1] N. Kimizuka, and T. Mohri, *Journal of Solid State Chemistry*, Vol. 60, 1985, pp. 382-384
[Non-Patent Document 2] N. Kimizuka, M. Isobe, and M. Nakamura, *Journal of Solid State Chemistry*, Vol. 116, 1995, pp. 170-178
[Non-Patent Document 3] S. Yamazaki, T. Hirohashi, M. Takahashi, S. Adachi, M. Tsubuku, J. Koezuka, K. Okazaki, Y. Kanzaki, H. Matsukizono, S. Kaneko, S. Mori, and T. Matsuo, *Journal of the Society for Information Display*, Vol. 22, Issue 1, 2014, pp. 55-67
[Non-Patent Document 4] S. Yamazaki, T. Atsumi, K. Dairiki, K. Okazaki, and N. Kimizuka, *ECS Journal of Solid State Science and Technology*, Vol. 3, Issue 9, 2014, pp. Q3012-Q3022

SUMMARY OF THE INVENTION

An object is to provide a semiconductor device that includes transistors with different threshold voltages. Alternatively, an object is to provide a semiconductor device including a plurality of kinds of circuits and transistors whose electrical characteristics are different between the circuits. Alternatively, an object is to provide a semiconductor device including a memory element. Alternatively, an object is to provide a semiconductor device that includes a memory element having a long retention period and a memory element having high operation speed. Alternatively, an object is to provide a semiconductor device that includes a plurality of kinds of memory elements and transistors whose electrical characteristics are different between the memory elements. Alternatively, an object is to provide a highly integrated semiconductor device.

Alternatively, an object is to provide a module including any of the above semiconductor devices. Alternatively, an object is to provide an electronic device including any of the above semiconductor devices or the module. Alternatively, an object is to provide a novel semiconductor device. Alternatively, an object is to provide a novel module. Alternatively, an object is to provide a novel electronic device.

Alternatively, an object is to provide a transistor having normally-off electrical characteristics. Alternatively, an object is to provide a transistor having a low leakage current in an off state. Alternatively, an object is to provide a transistor having a small subthreshold swing value. Alternatively, an object is to provide a transistor having a small short-channel effect. Alternatively, an object is to provide a transistor having excellent electrical characteristics. Alternatively, an object is to provide a transistor having high reliability. Alternatively, an object is to provide a transistor having high frequency characteristics.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is, for example, a semiconductor device that includes a first circuit, a second circuit, and a third circuit. The first circuit includes a first transistor, a first capacitor, and a first wiring. The first transistor includes a first conductor and a first oxide semiconductor. The first conductor includes a region in contact with the first oxide semiconductor. One terminal of the first capacitor is electrically connected to the first conductor. The other terminal of the first capacitor is electrically connected to the first wiring. The second circuit includes a second transistor, a second capacitor, and a second wiring. The second transistor includes a second conductor and a second oxide semiconductor. The second conductor includes a region in contact with the second oxide semiconductor. One terminal of the second capacitor is electrically connected to the second conductor. The other terminal of the second capacitor is electrically connected to the second wiring. The third circuit includes a third transistor. The third transistor includes a third conductor, a third oxide semiconductor, a first insulator, a second insulator, and a third insulator. The third conductor includes a region in which the third conductor and the third oxide semiconductor overlap with each other. The first insulator is positioned between the third conductor and the third oxide semiconductor. The second insulator is positioned between the third conductor and the first insulator. The third insulator is positioned between the third conductor and the second insulator. The second insulator includes an electron trap region. A gate voltage at which a drain current in a subthreshold region is $1\times10^{-12}$ A is greater than or equal to 0.8 V and less than or equal to 1.5 V in the first transistor. A gate voltage at which a drain current in a subthreshold region is $1\times10^{-12}$ A is greater than or equal to 0 V and less than or equal to 0.7 V in the second transistor.

(2) Alternatively, one embodiment of the present invention is the semiconductor device described in (1), in which the second insulator is an oxide or a nitride containing boron, aluminum, silicon, scandium, titanium, gallium, yttrium, zirconium, indium, lanthanum, cerium, neodymium, hafnium, or thallium.

(3) Alternatively, one embodiment of the present invention is the semiconductor device described in (1) or (2), in which the first transistor further includes a fourth conductor, a fourth insulator, a fifth insulator, and a sixth insulator; the fourth conductor includes a region in which the fourth conductor and the first oxide semiconductor overlap with each other; the fourth insulator is positioned between the fourth conductor and the first oxide semiconductor; the fifth insulator is positioned between the fourth conductor and the fourth insulator; the sixth insulator is positioned between the fourth conductor and the fifth insulator; and the fifth insulator includes a negatively charged region.

(4) Alternatively, one embodiment of the present invention is the semiconductor device described in (3), in which the fifth insulator is an oxide or a nitride containing boron, aluminum, silicon, scandium, titanium, gallium, yttrium, zirconium, indium, lanthanum, cerium, neodymium, hafnium, or thallium.

(5) Alternatively, one embodiment of the present invention is the semiconductor device described in any one of (1) to (4), in which the second transistor further includes a fifth conductor, a seventh insulator, an eighth insulator, and a ninth insulator; the fifth conductor includes a region in which the fifth conductor and the second oxide semiconductor overlap with each other; the seventh insulator is positioned between the fifth conductor and the second oxide semiconductor; the eighth insulator is positioned between the fifth conductor and the seventh insulator; the ninth insulator is positioned between the fifth conductor and the eighth insulator; and the eighth insulator includes a negatively charged region.

(6) Alternatively, one embodiment of the present invention is the semiconductor device described in (5), in which the eighth insulator is an oxide or a nitride containing boron, aluminum, silicon, scandium, titanium, gallium, yttrium, zirconium, indium, lanthanum, cerium, neodymium, hafnium, or thallium.

(7) Alternatively, one embodiment of the present invention is the semiconductor device described in any one of (1) to (6), in which the first transistor further includes a sixth conductor and a ninth insulator; the sixth conductor includes a region in which the sixth conductor and the first oxide semiconductor overlap with each other; and the ninth insulator is positioned between the sixth conductor and the first oxide semiconductor.

(8) Alternatively, one embodiment of the present invention is the semiconductor device described in (7), in which the first transistor further includes a tenth insulator and an eleventh insulator; the tenth insulator is positioned between the sixth conductor and the ninth insulator; the eleventh insulator is positioned between the sixth conductor and the tenth insulator; and the tenth insulator includes a negatively charged region.

(9) Alternatively, one embodiment of the present invention is the semiconductor device described in (8), in which the tenth insulator is an oxide or a nitride containing boron, aluminum, silicon, scandium, titanium, gallium, yttrium, zirconium, indium, lanthanum, cerium, neodymium, hafnium, or thallium.

(10) Alternatively, one embodiment of the present invention is the semiconductor device described in any one of (1) to (9), in which the second transistor further includes an seventh conductor and a twelfth insulator; the seventh conductor includes a region in which the seventh conductor and the second oxide semiconductor overlap with each other; and the twelfth insulator is positioned between the seventh conductor and the second oxide semiconductor.

(11) Alternatively, one embodiment of the present invention is the semiconductor device described in (10), in which the second transistor further includes a thirteenth insulator and a fourteenth insulator; the thirteenth insulator is positioned between the seventh conductor and the twelfth insulator; the fourteenth insulator is positioned between the seventh conductor and the thirteenth insulator; and the thirteenth insulator includes a negatively charged region.

(12) Alternatively, one embodiment of the present invention is the semiconductor device described in (11), in which the thirteenth insulator is an oxide or a nitride containing boron, aluminum, silicon, scandium, titanium, gallium, yttrium, zirconium, indium, lanthanum, cerium, neodymium, hafnium, or thallium.

(13) Alternatively, one embodiment of the present invention is the semiconductor device described in any one of (1) to (12), in which the third transistor further includes a eighth conductor and a fifteenth insulator; the eighth conductor includes a region in which the eighth conductor and the third oxide semiconductor overlap with each other; and the fifteenth insulator is positioned between the eighth conductor and the third oxide semiconductor.

(14) Alternatively, one embodiment of the present invention is the semiconductor device described in (13), in which the third transistor further includes a sixteenth insulator and a seventeenth insulator; the sixteenth insulator is positioned between the eighth conductor and the fifteenth insulator; the seventeenth insulator is positioned between the eighth conductor and the sixteenth insulator; and the sixteenth insulator includes a negatively charged region.

(15) Alternatively, one embodiment of the present invention is the semiconductor device described in (14), in which the sixteenth insulator is an oxide or a nitride containing boron, aluminum, silicon, scandium, titanium, gallium, yttrium, zirconium, indium, lanthanum, cerium, neodymium, hafnium, or thallium.

(16) Alternatively, one embodiment of the present invention is the semiconductor device described in any one of (1) to (15), in which the first circuit further includes a fourth transistor; the fourth transistor includes a first semiconductor, a ninth conductor, and an eighteenth insulator; the ninth conductor includes a region in which the ninth conductor and the first semiconductor overlap with each other; the eighteenth insulator is positioned between the ninth conductor and the first semiconductor; and the ninth conductor is electrically connected to the first conductor.

(17) Alternatively, one embodiment of the present invention is the semiconductor device described in (16), in which the fourth transistor includes a region in which the fourth transistor and the first transistor or the first capacitor overlap with each other.

(18) Alternatively, one embodiment of the present invention is the semiconductor device described in any one of (1) to (17), in which the second circuit further includes a fifth transistor; the fifth transistor includes a second semiconductor, an tenth conductor, and a nineteenth insulator; the tenth conductor includes a region in which the tenth conductor and the second semiconductor overlap with each other; the nineteenth insulator is positioned between the tenth conductor and the second semiconductor; and the tenth conductor is electrically connected to the second conductor.

(19) Alternatively, one embodiment of the present invention is the semiconductor device described in (18), in which the fifth transistor includes a region in which the fifth transistor and the second transistor or the second capacitor overlap with each other.

(20) Alternatively, one embodiment of the present invention is the semiconductor device described in any one of (1) to (19), in which the first oxide semiconductor, the second oxide semiconductor, and the third oxide semiconductor are positioned in the same layer.

A semiconductor device that includes transistors with different threshold voltages can be provided. Alternatively, a semiconductor device including a plurality of kinds of circuits and transistors whose electrical characteristics are different between the circuits can be provided. Alternatively, a semiconductor device including a memory element can be provided. Alternatively, a semiconductor device that includes a memory element having a long retention period and a memory element having high operation speed can be provided. Alternatively, a semiconductor device that includes a plurality of kinds of memory elements and transistors whose electrical characteristics are different between the memory elements can be provided. Alternatively, a highly integrated semiconductor device can be provided.

Alternatively, a module including any of the above semiconductor devices can be provided. Alternatively, an electronic device including any of the above semiconductor devices or the module can be provided. Alternatively, a novel semiconductor device can be provided. Alternatively, a novel module can be provided. Alternatively, a novel electronic device can be provided.

Alternatively, a transistor having normally-off electrical characteristics can be provided. Alternatively, a transistor having a low leakage current in an off state can be provided. Alternatively, a transistor having a small subthreshold swing value can be provided. Alternatively, a transistor having a small short-channel effect can be provided. Alternatively, a transistor having excellent electrical characteristics can be provided. Alternatively, a transistor having high reliability can be provided. Alternatively, a transistor having high frequency characteristics can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIG. 2 is a block diagram of a semiconductor device of one embodiment of the present invention.

FIGS. 22A to 22D are Cs-corrected high-resolution TEM images of a plane of a CAAC-OS.

FIGS. 24A and 24B show electron diffraction patterns of a CAAC-OS.

DETAILED DESCRIPTION OF THE INVENTION

Figure 1:
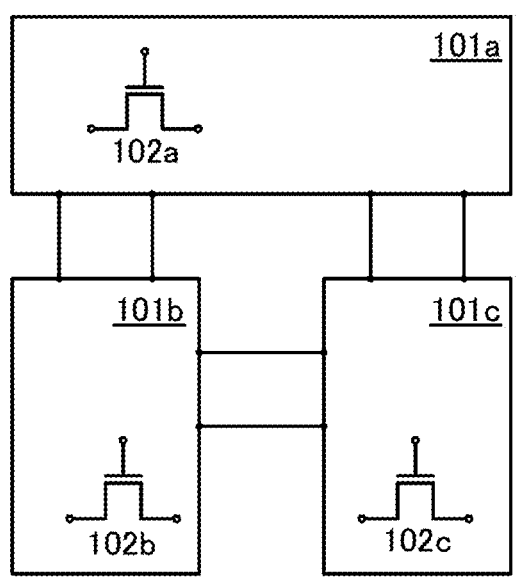
FIG. 1 is a block diagram of a semiconductor device of one embodiment of the present invention.

Embodiments of the present invention will be described in detail with the reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for clarification.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. In general, a potential (a voltage) is relative and is determined depending on the difference relative to a reference potential. Therefore, even a "ground potential," for example, is not necessarily 0 V. For example, in some cases, a "ground potential" is the lowest potential in a circuit. In other cases, a "ground potential" is a moderate potential in a circuit. In those cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies are sometimes formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B," "the average concentration in a region of A in the depth direction is B," "the median value of a concentration in a region of A in the depth direction is B," "the maximum value of a concentration in a region of A in the depth direction is B," "the minimum value of a concentration in a region of A in the depth direction is B," "a convergence value of a concentration in a region of A in the depth direction is B," and "a concentration in a region of A in which a probable value is obtained in measurement is B."

In this specification, the phrase "A has a region with a size B, a length B, a thickness B, a width B, or a distance B" includes, for example, "the size, the length, the thickness, the width, or the distance of the entire region in a region of A is B," "the average value of the size, the length, the thickness, the width, or the distance of a region of A is B," "the median value of the size, the length, the thickness, the width, or the distance of a region of A is B," "the maximum value of the size, the length, the thickness, the width, or the distance of a region of A is B," "the minimum value of the size, the length, the thickness, the width, or the distance of a region of A is B," "a convergence value of the size, the length, the thickness, the width, or the distance of a region of A is B," and "the size, the length, the thickness, the width, or the distance of a region of A in which a probable value is obtained in measurement is B."

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B in a plan view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Semiconductor Device>

A semiconductor device of one embodiment of the present invention is described below.

Note that the transistor is assumed to be of an n-channel type below. However, a term, a reference numeral, or the like may be replaced with an appropriate one in the following description when a p-channel transistor is used.

FIG. 1 is a block diagram of a semiconductor device 100 that includes a circuit 101*a*, a circuit 101*b*, and a circuit 101c. The circuit 101a, the circuit 101b, and the circuit 101c are electrically connected to one another. Note that the semiconductor device of one embodiment of the present invention is not limited to this structure. For example, the semiconductor device 100 does not necessarily include all of the circuit 101a, the circuit 101b, and the circuit 101c. Alternatively, in the semiconductor device 100, the circuit 101a and the circuit 101b are not necessarily electrically connected to each other in some cases. Alternatively, the circuit 101b and the circuit 101c are not necessarily electrically connected to each other in some cases. Alternatively, the circuit 101c and the circuit 101a are not necessarily electrically connected to each other in some cases.

The circuit 101a includes a transistor 102a. The circuit 101b includes a transistor 102b. The circuit 101c includes a transistor 102c. Here, the transistor 102a and the transistor 102b have different electrical characteristics. For example, the gate voltage at which a drain current in a subthreshold region is $1 \times 10^{-12}$ A is greater than or equal to 0 V and less than or equal to 0.7 V in the transistor 102a, and is greater than or equal to 0.8 V and less than or equal to 1.5 V in the transistor 102b. Note that a method for making the transistor 102a and the transistor 102b have different electrical characteristics will be described later. Note that the transistor 102b and the transistor 102c may have different electrical characteristics. Alternatively, the transistor 102c and the transistor 102a may have different electrical characteristics.

Since the transistors have different electrical characteristics, the electrical characteristics of the transistors required in the respective circuits can be achieved in parallel. Accordingly, a semiconductor device having both high operation speed and low power consumption or the like can be provided.

FIG. 2 is a block diagram of an example of the semiconductor device 100 that is partly different from FIG. 1. The circuit 101a includes the transistor 102a, a transistor 103a, and a capacitor 104a. The circuit 101b includes the transistor 102b, a transistor 103b, and a capacitor 104b. The circuit 101c includes the transistor 102c.

The circuit 101a in FIG. 2 is different from that in FIG. 1 in that the transistor 103a and the capacitor 104a are provided. A gate terminal of the transistor 103a is electrically connected to one of a source terminal and a drain terminal of the transistor 102a and one terminal of the capacitor 104a through a node A. The potential of the node A can be changed with the transistor 102a. The potential of the node A is held by turning off the transistor 102a. Drain current of the transistor 103a depends on the potential of the node A; accordingly, the circuit 101a has a function of retaining data. In other words, the circuit 101a can be used as a memory device. However, the circuit 101a is not necessarily used as a memory device.

Here, the data retained at the node A might be lost through the transistor 102a, the transistor 103a, and the capacitor 104a. Note that when leakage current of a gate insulator of the transistor 103a and leakage current of a dielectric of the capacitor 104a are sufficiently low, current flowing between the source terminal and the drain terminal of the transistor 102a is the main cause of the loss of data retained at the node A. Therefore, the use of a transistor with low off-state current as the transistor 102a enables the data to be retained at the node A for a long time. Note that a specific example of a transistor with low off-state current will be described later.

The circuit 101b in FIG. 2 is different from that in FIG. 1 in that the transistor 103b and the capacitor 104b are provided. A gate terminal of the transistor 103b is electrically connected to one of a source terminal and a drain terminal of the transistor 102b and one terminal of the capacitor 104b through a node B. That is, the circuit 101b has a structure similar to that of the circuit 101a.

The circuit 101a can be differentiated from the circuit 101b by setting the threshold voltage of the transistor 102a higher than that of the transistor 102b. Due to the higher threshold voltage of the transistor 102a, the circuit 101a can retain data at the node A for a long time. Due to the lower threshold voltage of the transistor 102b, the circuit 101b can write data in the node B at high speed.

For example, the circuit 101b is used for operation where the speed of writing operation is more important than the length of a data retention period, and the circuit 101a is used for operation where the length of a data retention period is more important than the speed of writing operation, whereby the semiconductor device 100 can have high operation speed and low power consumption.

When the gate voltage at which a drain current in a subthreshold region is $1 \times 10^{-12}$ A (hereinafter referred to as Shift) is greater than or equal to 0.8 V and less than or equal to 1.5 V in the transistor 102a, for example, the data at the node A can be retained for a long time without gate voltage application to the transistor 102a. Accordingly, the circuit 101a does not need to be supplied with power for data retention, which reduces power consumption of the semiconductor device 100. Even when power supply to the semiconductor device 100 is stopped, the data just before the stop of power supply is retained in the circuit 101a. Thus, the semiconductor device 100 can operate immediately after power supply is restarted. In the case where the transistor 102b has a Shift of greater than or equal to 0 V and less than or equal to 0.7 V, the gate voltage of the transistor 102b which is needed for writing data in the node B can be low. When the gate voltage is low, data can be written in the node B at high speed. Power consumed for writing data in the node B can also be low.

The circuit 101c in FIG. 2 is different from the circuit 101c in FIG. 1 in that the transistor 102c has a second gate terminal (also referred to as back gate terminal). On the second gate terminal side of the transistor 102c, a floating gate C (denoted as a dashed line portion in FIG. 2) is placed. For example, voltage is applied to the second gate terminal while drain voltage is applied to the transistor 102c, whereby electrons can be injected into the floating gate C. The electrons injected into the floating gate C behave as if they are fixed charges. Accordingly, the threshold voltage of the transistor 102c depends on the amount of electrons injected into the floating gate C. Drain current of the transistor 102c depends on the potential of the floating gate C; accordingly, the circuit 101c has a function of retaining data. In other words, the circuit 101c can be used as a memory device. However, the circuit 101c is not necessarily used as a memory device.

The transistor 102c writes data through electron injection into the floating gate C. Thus, voltage necessary for data writing is higher in the circuit 101c than in the circuit 101a and the circuit 101b in theory. In other words, the speed of writing operation might be low or the power consumed for writing might be high. On the other hand, when the floating gate C is sufficiently insulated, data loss is unlikely to be caused and the data retention period can be very long. In view of the above, the circuit 101c is suitable for retention of data which is rewritten less frequently. Alternatively, the circuit 101c may be used as a nonrewritable memory device (write-once memory). When it is used as a nonrewritable memory device, a trouble caused by change of data or the like is unlikely to occur and thus, the semiconductor device 100 can have increased reliability.

In this manner, a semiconductor device can have high reliability and low power consumption by including a circuit suitable for long-term data retention, a circuit with high operation speed, and a circuit highly reliable in long-term data retention.

The above circuit configurations are examples, and the configurations of the circuit 101a, the circuit 101b, and the circuit 101c can be changed as appropriate. For example, FIGS. 3A to 3D, FIGS. 4A to 4D, and FIGS. 5A to 5C illustrate configuration examples of the circuit 101a which are different from those in FIGS. 1 and 2. Note that although FIGS. 3A to 3D, FIGS. 4A to 4D, and FIGS. 5A to 5C illustrate the circuit 101a as an example, the configuration examples can also be applied to the circuit 101b or the circuit 101c.

Figure 3A:
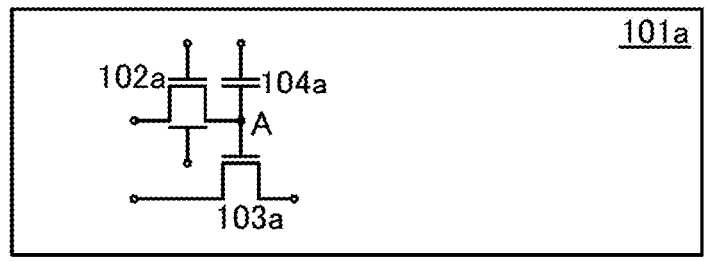
FIGS. 3A to 3D are circuit diagrams of a semiconductor device of one embodiment of the present invention.

The circuit 101a in FIG. 3A is different from the circuit 101a in FIG. 2 in that the transistor 102a includes a second gate terminal. When a given potential is applied to the second gate terminal of the transistor 102a, for example, the threshold voltage of the transistor 102a or the like can be changed. When the second gate terminal and a gate terminal of the transistor 102a are electrically connected to each other, for example, the transistor 102a can have high on-state current. Moreover, leakage current due to a punch-through phenomenon can be low, which leads to a small subthreshold swing value (also referred to as S value) and low off-state current. Specifically, the S value can be greater than or equal to 60 mV/dec and less than or equal to 150 mV/dec, greater than or equal to 60 mV/dec and less than or equal to 120 mV/dec, greater than or equal to 60 mV/dec and less than or equal to 100 mV/dec, or greater than or equal to 60 mV/dec and less than or equal to 80 mV/dec. When the second gate terminal and the source terminal of the transistor 102a are electrically connected to each other, for example, it is possible to reduce a variation in the electrical characteristics of the transistors 102a which is due to a step or a position in a substrate.

Figure 3B:
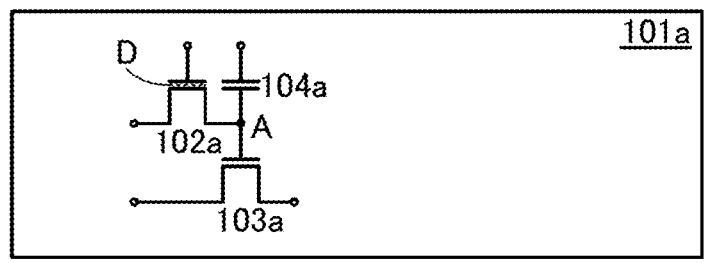

The circuit 101a in FIG. 3B is different from the circuit 101a in FIG. 2 in that the transistor 102a includes a floating gate D on the gate terminal side. Electrons can be injected into the floating gate D by a method similar to that used to inject electrons into the floating gate C of the circuit 101c in FIG. 2. When electrons are injected into the floating gate D, the threshold voltage of the transistor 102a or the like can be changed. For example, by adjusting the injection amount of electrons, the transistor 102a can have a Shift of greater than or equal to 0.8 V and less than or equal to 1.5 V.

Figure 3C:
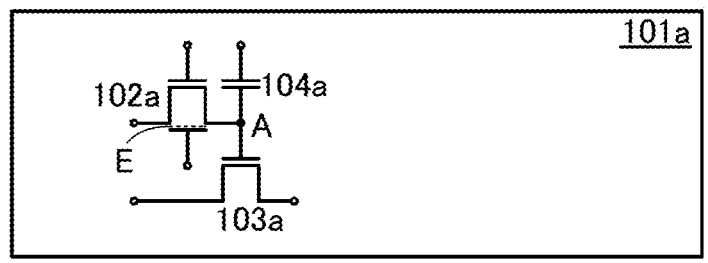

The circuit 101a in FIG. 3C is different from the circuit 101a in FIG. 2 in that the transistor 102a includes the second gate terminal, and a floating gate E on the second gate terminal side. Electrons can be injected into the floating gate E by a method similar to that used to inject electrons into the floating gate C of the circuit 101c in FIG. 2. When electrons are injected into the floating gate E, the threshold voltage of the transistor 102a or the like can be changed. For example, by adjusting the injection amount of electrons, the transistor 102a can have a Shift of greater than or equal to 0.8 V and less than or equal to 1.5 V.

Figure 3D:
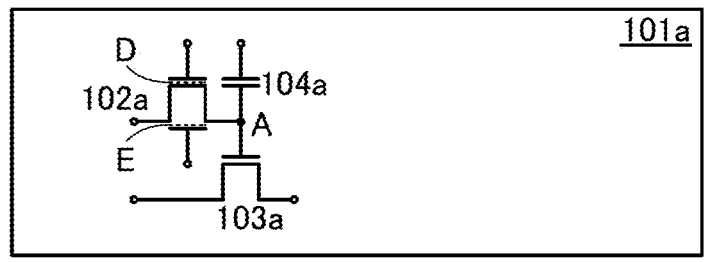

The circuit 101a in FIG. 3D is different from the circuit 101a in FIG. 2 in that the transistor 102a includes the floating gate D on the gate terminal side, the second gate terminal, and the floating gate E on the second gate terminal side. Electrons can be injected into the floating gate D and/or the floating gate E by a method similar to that used to inject electrons into the floating gate C of the circuit 101c in FIG. 2. When electrons are injected into the floating gate D and/or the floating gate E, the threshold voltage or the like of the transistor 102a can be changed. For example, by adjusting the injection amount of electrons, the transistor 102a can have a Shift of greater than or equal to 0.8 V and less than or equal to 1.5 V.

Figure 4A:
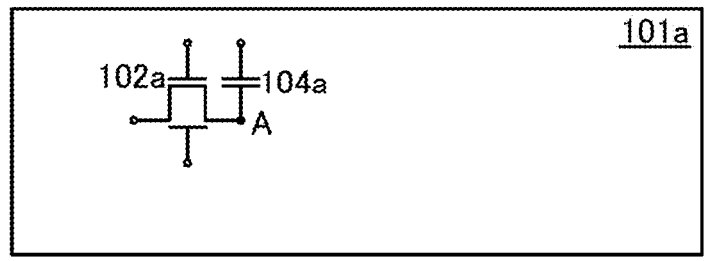
FIGS. 4A to 4D are circuit diagrams of a semiconductor device of one embodiment of the present invention.

The circuit 101a in FIG. 4A is different from the circuit 101a in FIG. 3A in that the transistor 103a is not provided. Since the transistor 103a is not provided, data retained at the node A is read with the transistor 102a. The transistor 102a is turned on, whereby the data retained at the node A is lost in every reading. However, data loss can be prevented by writing data in every reading. Since the transistor 103a is not provided, the area of the circuit 101a in the semiconductor device 100 can be smaller than in the case where the circuit 101a has the structure in FIG. 3A. Note that although the transistor 102a includes the second gate terminal in the above examples, the present invention is not limited thereto. The transistor 102a does not necessarily include the second gate terminal.

Figure 4B:
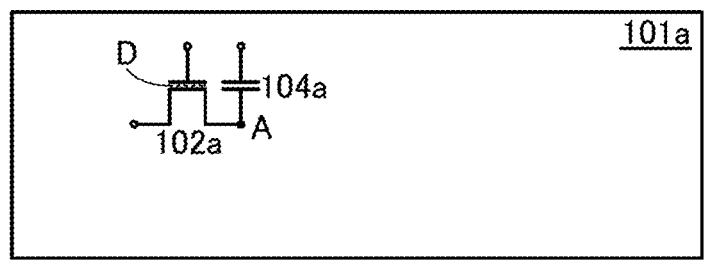

The circuit 101a in FIG. 4B is different from the circuit 101a in FIG. 3B in that the transistor 103a is not provided. Since the transistor 103a is not provided, the area of the circuit 101a in the semiconductor device 100 can be smaller than in the case where the circuit 101a has the structure in FIG. 3B.

Figure 4C:
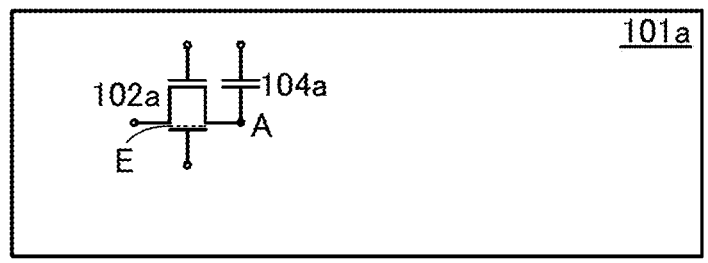

The circuit 101a in FIG. 4C is different from the circuit 101a in FIG. 3C in that the transistor 103a is not provided. Since the transistor 103a is not provided, the area of the circuit 101a in the semiconductor device 100 can be smaller than in the case where the circuit 101a has the structure in FIG. 3C.

Figure 4D:
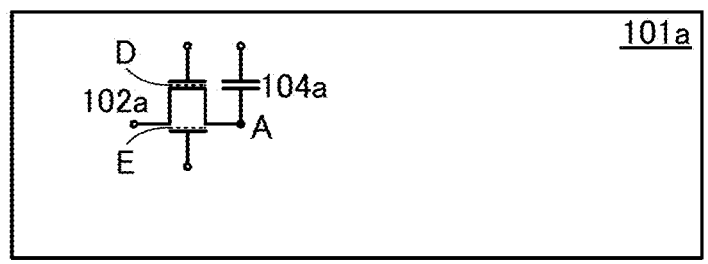

The circuit 101a in FIG. 4D is different from the circuit 101a in FIG. 3D in that the transistor 103a is not provided. Since the transistor 103a is not provided, the area of the circuit 101a in the semiconductor device 100 can be smaller than in the case where the circuit 101a has the structure in FIG. 3D.

Figure 5A:
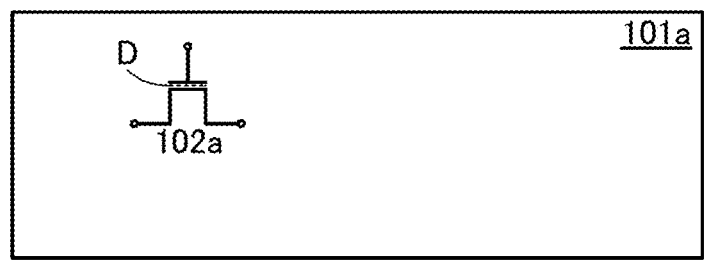
FIGS. 5A to 5C are circuit diagrams of a semiconductor device of one embodiment of the present invention.

The circuit 101a in FIG. 5A is different from the circuit 101a in FIG. 4B in that the capacitor 104a is not provided. For example, voltage is applied to the gate terminal while drain voltage is applied to the transistor 102a, whereby electrons can be injected into the floating gate D. The electrons injected into the floating gate D behave as if they are fixed charges. Accordingly, the threshold voltage of the transistor 102a depends on the amount of electrons injected into the floating gate D. Drain current of the transistor 102a depends on the potential of the floating gate D; accordingly, the circuit 101a has a function of retaining data. In other words, the circuit 101a can be used as a memory device. However, the circuit 101a is not necessarily used as a memory device. Since the circuit 101a does not include the capacitor 104a, the area of the circuit 101a in the semiconductor device 100 can be smaller than in the case where the circuit 101a has the structure in FIG. 4B.

Figure 5B:
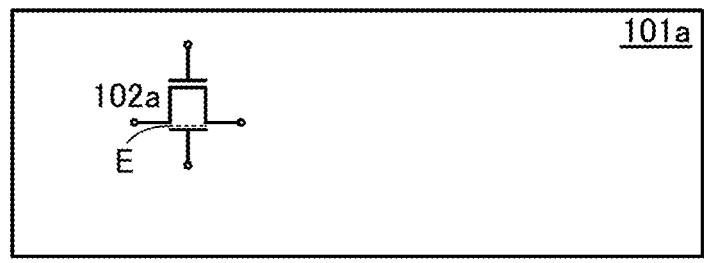

The circuit 101a in FIG. 5B is different from the circuit 101a in FIG. 4C in that the capacitor 104a is not provided. Since the capacitor 104a is not provided, the area of the circuit 101a in the semiconductor device 100 can be smaller than in the case where the circuit 101a has the structure in FIG. 4C.

Figure 5C:
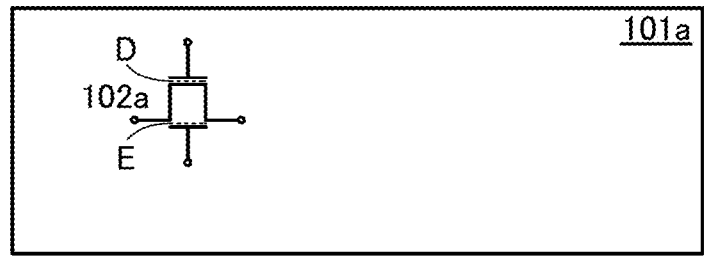

The circuit 101a in FIG. 5C is different from the circuit 101a in FIG. 4D in that the capacitor 104a is not provided. Since the capacitor 104a is not provided, the area of the circuit 101a in the semiconductor device 100 can be smaller than in the case where the circuit 101a has the structure in FIG. 4D.

<Structure of Semiconductor Device>

An example of a structure of a semiconductor device of one embodiment of the present invention is shown below.

Figure 6:
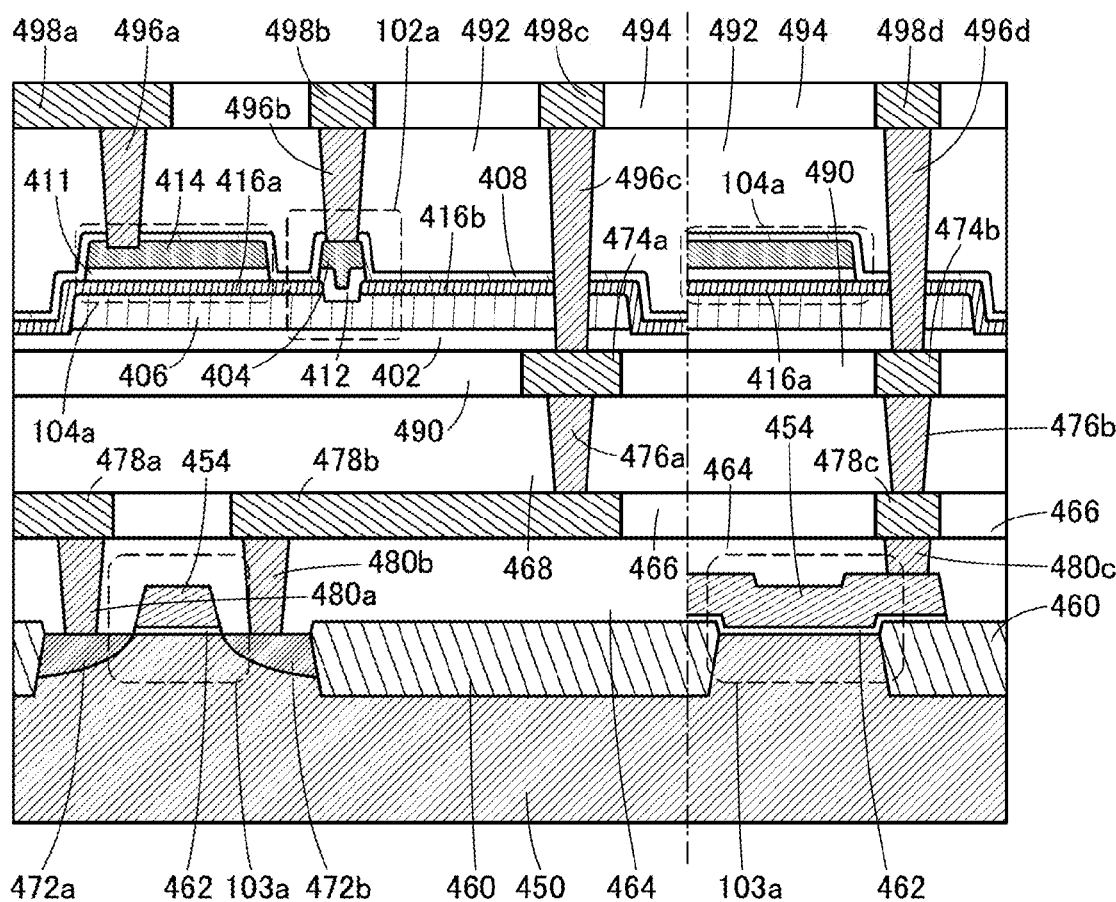
FIG. 6 is a cross-sectional view illustrating a semiconductor device of one embodiment of the present invention.

FIG. 6 is a cross-sectional view of the circuit 101a shown in FIG. 2. Note that the structure of FIG. 6 may be applied to the circuit 101b and the circuit 101c.

The circuit 101a in FIG. 6 includes the transistor 103a, the transistor 102a, and the capacitor 104a. The transistor 102a and the capacitor 104a are positioned over the transistor 103a.

The transistor 103a shown in FIG. 6 is a transistor using a semiconductor substrate 450. The transistor 103a includes a region 472a in the semiconductor substrate 450, a region 472b in the semiconductor substrate 450, an insulator 462, and a conductor 454.

In the transistor 103a, the regions 472a and 472b have functions of a source region and a drain region. The insulator 462 has a function of a gate insulator. The conductor 454 has a function of a gate electrode. Therefore, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 103a is formed. Alternatively, the semiconductor substrate 450 may be an i-type semiconductor substrate.

A top surface of the semiconductor substrate 450 preferably has a (110) plane. Thus, on-state characteristics of the transistor 103a can be improved.

The regions 472a and 472b are regions including impurities imparting the p-type conductivity. Accordingly, the transistor 103a has a structure of a p-channel transistor.

Note that the transistor 103a is separated from an adjacent transistor by a region 460 and the like. The region 460 is an insulating region.

The transistor 102a in FIG. 6 includes an insulator 402, an insulator 412, an insulator 408, a semiconductor 406, a conductor 416a, a conductor 416b, and a conductor 404. The semiconductor 406 is placed over the insulator 402. The insulator 412 is placed over the semiconductor 406. The conductor 404 is placed over the insulator 412. The conductor 416a and the conductor 416b are placed in contact with the semiconductor 406. The insulator 408 is placed over the insulator 412, the conductor 404, the conductor 416a, and the conductor 416b.

The conductor 404 serves as the gate electrode of the transistor 102a. Accordingly, the insulator 412 serves as a gate insulator of the transistor 102a. The conductors 416a and 416b function as the source electrode and the drain electrode of the transistor 102a, respectively. The insulator 408 functions as a barrier layer. The insulator 408 has, for example, a function of blocking oxygen and/or hydrogen.

The insulator 408 has, for example, a higher capability of blocking oxygen and/or hydrogen than the insulator 402 or the insulator 412.

Details about the transistor 102a will be described later.

The capacitor 104a in FIG. 6 includes a conductor 416a, a conductor 414, and an insulator 411. The insulator 411 is placed over the conductor 416a. The conductor 414 is placed over the insulator 411.

The conductor 416a functions as one of a pair of electrodes of the capacitor 104a. The conductor 414 functions as the other of the pair of electrodes of the capacitor 104a. The insulator 411 functions as a dielectric of the capacitor 104a.

For the capacitor 104a, the conductor 416a that is a component of the transistor 102a can be used. The insulator 411 can be formed by the same step as the insulator 412 of the transistor 102a. The conductor 414 can be formed by the same step as the conductor 404 of the transistor 102a. The capacitor 104a and the transistor 102a can be formed by common steps, and this inhibits an increase in manufacturing cost. Since the number of steps is not increased, the yield of the circuit 101a can be high. Note that not the conductor 416a but a different conductor may be used as one of the pair of electrodes of the capacitor.

The circuit 101a shown in FIG. 6 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 496a, a conductor 496b, a conductor 496c, a conductor 496d, a conductor 498a, a conductor 498b, a conductor 498c, a conductor 498d, an insulator 490, an insulator 492, and an insulator 494.

The insulator 464 is placed over the transistor 103a. The insulator 466 is placed over the insulator 464. The insulator 468 is placed over the insulator 466. The insulator 490 is placed over the insulator 468. The transistor 102a is placed over the insulator 490. The insulator 492 is placed over the transistor 102a. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 490 includes an opening reaching the conductor 476a, and an opening reaching the conductor 476b. In the openings, the conductor 474a and the conductor 474b are embedded.

The insulator 492 includes an opening reaching the conductor 414 that is the other of the pair of electrodes of the capacitor 104a, an opening reaching the conductor 404 that is the gate electrode of the transistor 102a, an opening reaching the conductor 474a through the conductor 416b that is one of the source electrode and the drain electrode of the transistor 102a, and an opening reaching the conductor 474b through the conductor 416a that is the other of the source electrode and the drain electrode of the transistor 102a. In the openings, the conductor 496a, the conductor 496b, the conductor 496c, and the conductor 496d are embedded. Note that in some cases, the openings are provided through any of components of the transistor 102a or the like.

In addition, the insulator 494 includes an opening reaching the conductor 496a, an opening reaching the conductor 496b, an opening reaching the conductor 496c, and an opening reaching the conductor 496d. In the openings, the conductor 498a, the conductor 498b, the conductor 498c, and the conductor 498d are embedded.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulators 464, 466, 468, 490, 492, and 494 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 490, 492, and 494. When an insulator that has a function of blocking oxygen and impurities such as hydrogen is placed near the transistor 102a, the electrical characteristics of the transistor 102a can be stable.

An insulator with a function of blocking oxygen and impurities such as hydrogen may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 496a, the conductor 496b, the conductor 496c, the conductor 496d, the conductor 498a, the conductor 498b, the conductor 498c, and the conductor 498d may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

One of the source and the drain of the transistor 103a is electrically connected to the conductor 416b that is one of the source electrode and the drain electrode of the transistor 102a through the conductors 480a, 478a, 476a, 474a, and 496c. Furthermore, the conductor 454 that is the gate electrode of the transistor 103a is electrically connected to the conductor 416a that is the other of the source electrode and the drain electrode of the transistor 102a through the conductors 480c, 478c, 476b, 474b, and 496d.

Figure 7:
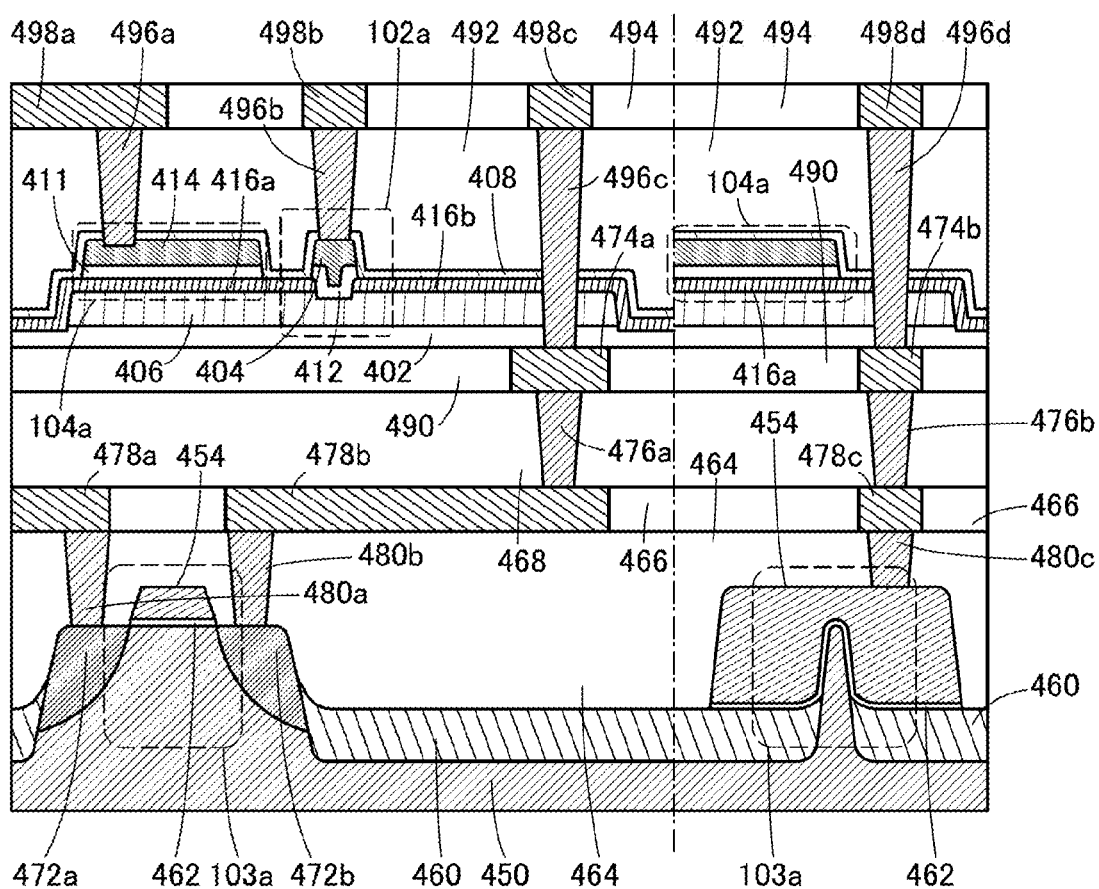
FIG. 7 is a cross-sectional view illustrating a semiconductor device of one embodiment of the present invention.

Note that the circuit 101a in FIG. 7 is the same as the circuit 101a in FIG. 6 except the structure of the transistor 103a. Therefore, the description of the circuit 101a in FIG. 6 is referred to for the circuit 101a in FIG. 7. Specifically, in the circuit 101a in FIG. 7, the transistor 103a is a FIN-type transistor. The effective channel width is increased in the FIN-type transistor 103a, whereby the on-state characteristics of the transistor 103a can be improved. In addition, since contribution of the electric field of the gate electrode can be increased, the off-state characteristics of the transistor 103a can be improved.

Figure 8:
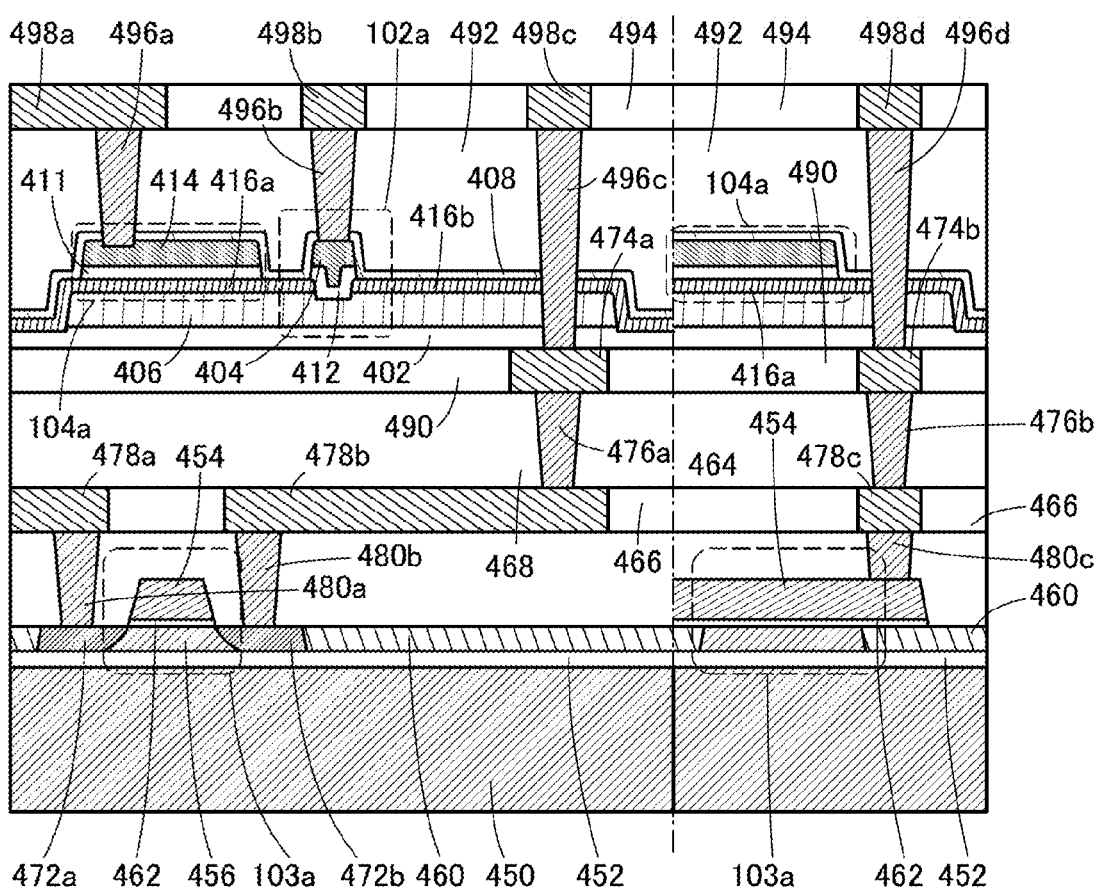
FIG. 8 is a cross-sectional view illustrating a semiconductor device of one embodiment of the present invention.

The circuit 101a in FIG. 8 is the same as the circuit 101a in FIG. 6 except the structure of the transistor 103a. Therefore, the description of the circuit 101a in FIG. 6 is referred to for the circuit 101a in FIG. 8. Specifically, in the circuit 101a in FIG. 8, the transistor 103a is provided in the semiconductor substrate 450 that is a silicon on insulator (SOI) substrate. In the structure in FIG. 8, a region 456 is separated from the semiconductor substrate 450 with an insulator 452 provided therebetween. Since the SOI substrate is used as the semiconductor substrate 450, a punch-through phenomenon and the like can be suppressed; thus, the off-state characteristics of the transistor 103a can be improved. Note that the insulator 452 can be formed by turning the semiconductor substrate 450 into an insulator. For example, silicon oxide can be used as the insulator 452.

<Structure of Transistor>

Figure 9A:
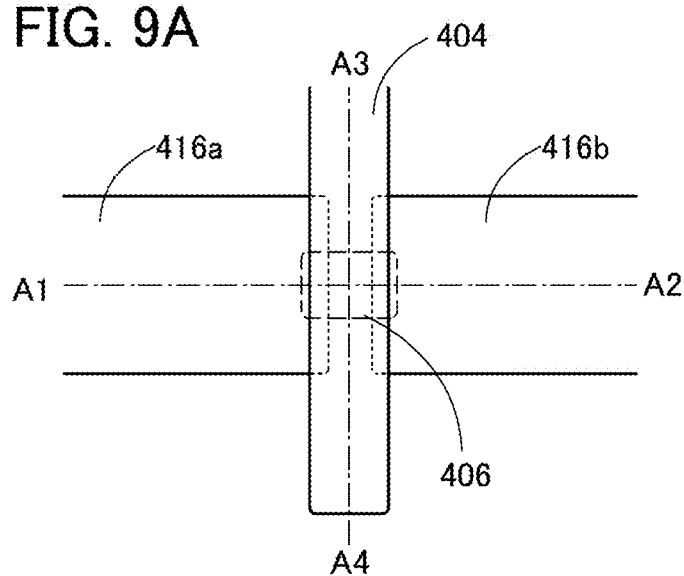
FIGS. 9A and 9B are a plan view and a cross-sectional view illustrating a transistor of one embodiment of the present invention.
Figure 9B:
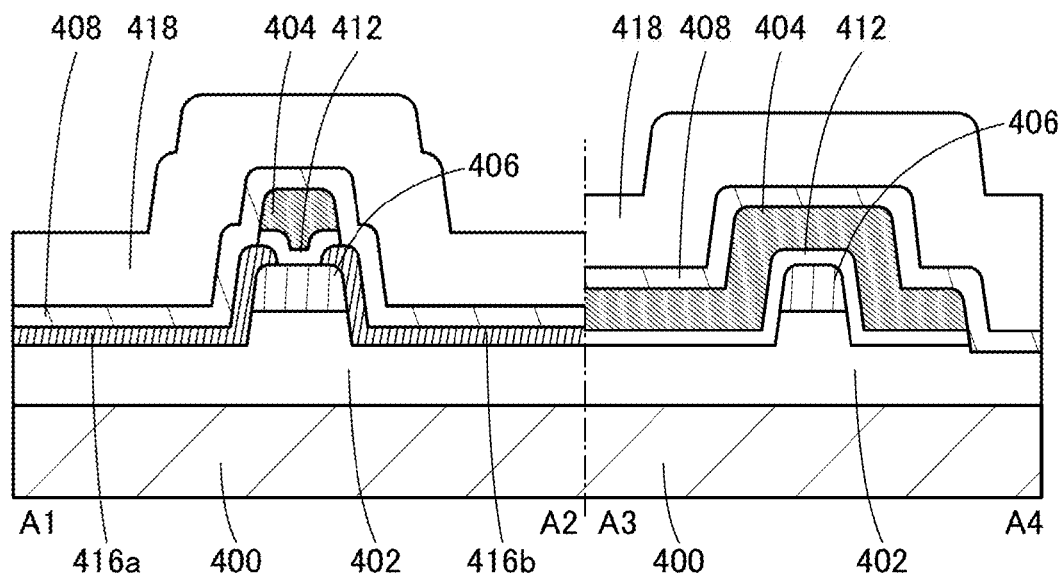

FIGS. 9A and 9B are a plan view and a cross-sectional view illustrating an example of a transistor that can be applied to the transistor 102a and the like. FIG. 9A is a plan view and FIG. 9B is a cross-sectional view taken along dashed-dotted line A1-A2 and dashed-dotted line A3-A4 in FIG. 9A. Note that for simplification of the drawing, some components are not illustrated in the plan view in FIG. 9A.

The transistor in FIGS. 9A and 9B includes an insulator 402 having a projection over the substrate 400, a semiconductor 406 over the projection of the insulator 402, a conductor 416a and a conductor 416b which are in contact with a top surface and a side surface of the semiconductor 406 and which are arranged to be apart from each other, an insulator 412 over the semiconductor 406, the conductor 416a, and the conductor 416b, a conductor 404 over the insulator 412, and an insulator 408 over the conductor 416a, the conductor 416b, and the conductor 404. Note that an insulator 418 is placed over the insulator 408.

The conductor 404 includes a region that faces the top surface and the side surface of the semiconductor 406 with the insulator 412 provided therebetween in the cross section taken along line A3-A4. The insulator 402 does not necessarily include a projection. The transistor does not necessarily include the insulator 408.

As illustrated in FIG. 9B, the side surface of the semiconductor 406 is in contact with the conductors 416a and 416b. The semiconductor 406 can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406 (the top, bottom, and side surfaces). In the s-channel structure, a large amount of current can flow between a source and a drain of the transistor, so that a high on-state current can be achieved.

In the case where the transistor has the s-channel structure, a channel is formed also in the side surface of the semiconductor 406. Therefore, as the semiconductor 406 has a larger thickness, the channel region becomes larger. In other words, the thicker the semiconductor 406 is, the larger the on-state current of the transistor is. In addition, when the semiconductor 406 is thicker, the proportion of the region with a high carrier controllability increases, leading to a smaller subthreshold swing value. For example, the semiconductor 406 has a region with a thickness greater than or equal to 10 nm, preferably greater than or equal to 20 nm, further preferably greater than or equal to 40 nm, still further preferably greater than or equal to 60 nm, yet still further preferably greater than or equal to 100 nm. In addition, to prevent a decrease in the productivity of the semiconductor device, the semiconductor 406 has a region with a thickness, for example, less than or equal to 300 nm, preferably less than or equal to 200 nm, further preferably less than or equal to 150 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

The insulator 402 is preferably an insulator containing excess oxygen.

The insulator containing excess oxygen means an insulator from which oxygen is released by heat treatment, for example. For example, a silicon oxide layer containing excess oxygen is a silicon oxide layer which can release oxygen by heat treatment or the like. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406.

The insulator containing excess oxygen has a function of reducing oxygen vacancies in the semiconductor 406 in some cases. Such oxygen vacancies serve as hole traps or the like in the semiconductor 406. In addition, hydrogen enters the site of such oxygen vacancies and forms electrons serving as carriers. Therefore, by reducing the oxygen vacancies in the semiconductor 406, the transistor can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in the range of a surface temperature of higher than or equal to 100° C. and lower than or equal to 700° C. or higher than or equal to 100° C. and lower than or equal to 500° C.

Here, the method for measuring the amount of released oxygen by TDS analysis is described below.

The total amount of released gas from a measurement sample in TDS analysis is proportional to the integral value of the ion intensity of the released gas. Then, comparison with a standard sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a standard sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times \alpha$$

The value $N_{H2}$ is obtained by conversion of the number of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. The value $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen is measured with a thermal desorption spectroscopy apparatus produced by ESCO Ltd., EMD-WA1000S/W using a silicon substrate containing hydrogen atoms at $1\times10^{16}$ atoms/cm', for example, as the standard sample.

Furthermore, in the TDS analysis, oxygen is partly detected as an oxygen atom. The ratio between oxygen molecules and oxygen atoms can be calculated from the ionization rate of oxygen molecules. Note that since the above α includes the ionization rate of oxygen molecules, the amount of released oxygen atoms can also be estimated through the evaluation of the amount of released oxygen molecules.

Note that $N_{O2}$ is the amount of released oxygen molecules. The amount of released oxygen in the case of being converted into oxygen atoms is twice the amount of released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

By placing a semiconductor over and under the semiconductor 406, electrical characteristics of the transistor can be increased in some cases. The semiconductor 406 and semiconductors placed over and under the semiconductor 406 will be described in detail below with reference to FIGS. 10A to 10E.

Figure 10A:
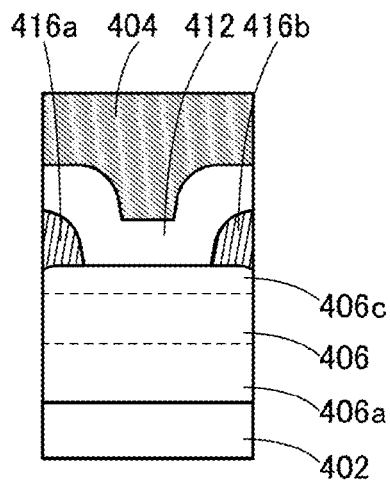
FIGS. 10A to 10D and FIG. 10E are cross-sectional views and a band diagram, respectively, each illustrating a transistor of one embodiment of the present invention.
Figure 10B:
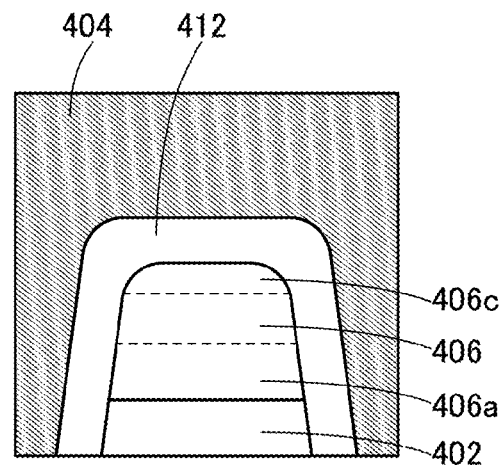

FIG. 10A is an enlarged cross-sectional view illustrating the semiconductor 406 and its vicinity of the transistor illustrated in FIG. 9B in the channel length direction. FIG. 10B is an enlarged cross-sectional view illustrating the semiconductor 406 and its vicinity of the transistor illustrated in FIG. 9B in the channel width direction.

In the transistor structure illustrated in FIGS. 10A and 10B, a semiconductor 406a is placed between the insulator 402 and the semiconductor 406. In addition, a semiconductor 406c is placed between the semiconductor 406 and the conductors 416a and 416b and between the semiconductor 406 and the insulator 412.

Figure 10C:
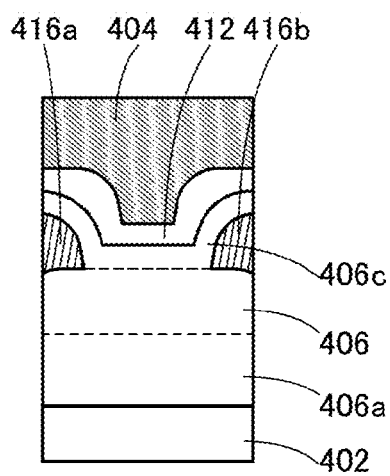
Figure 10D:
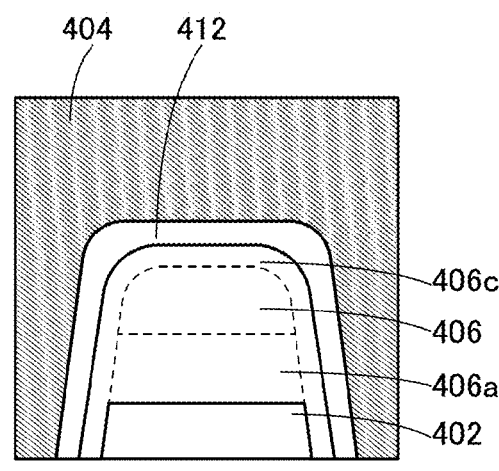
Figure 10E:
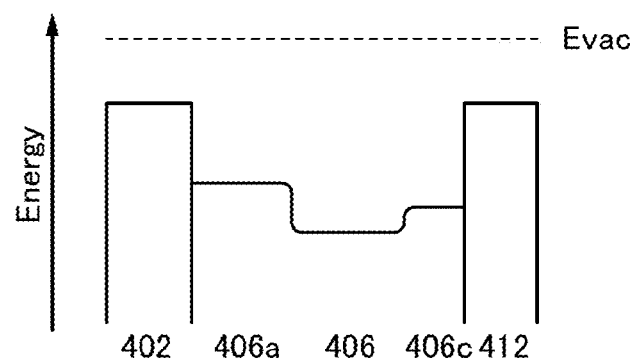

Alternatively, the transistor may have a structure illustrated in FIGS. 10C and 10D.

FIG. 10C is an enlarged cross-sectional view illustrating the semiconductor 406 and its vicinity of the transistor illustrated in FIG. 9B in the channel length direction. FIG. 10D is an enlarged cross-sectional view illustrating the semiconductor 406 and its vicinity of the transistor illustrated in FIG. 9B in the channel width direction.

In the transistor structure illustrated in FIGS. 10C and 10D, the semiconductor 406a is placed between the insulator 402 and the semiconductor 406. In addition, the semiconductor 406c is placed between the insulator 412 and the insulator 402, the conductors 416a and 416b, the semiconductor 406a, and the semiconductor 406.

The semiconductor 406 is an oxide semiconductor containing indium, for example. The oxide semiconductor 406 can have high carrier mobility (electron mobility) by containing indium, for example. The semiconductor 406 preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406 preferably contains zinc. When the oxide semiconductor contains zinc, the oxide semiconductor is easily crystallized, in some cases.

Note that the semiconductor 406 is not limited to the oxide semiconductor containing indium. The semiconductor 406 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406, an oxide with a wide energy gap may be used, for example. For example, the energy gap of the semiconductor 406 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406. Since the semiconductor 406a and the semiconductor 406c each include one or more elements, or two or more elements other than oxygen included in the semiconductor 406, a defect state is less likely to be formed at the interface between the semiconductor 406a and the semiconductor 406 and the interface between the semiconductor 406 and the semiconductor 406c.

The semiconductor 406a, the semiconductor 406, and the semiconductor 406c preferably include at least indium. In the case of using an In-M-Zn oxide as the semiconductor 406a, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406, when a summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the semiconductor 406c, when a summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406, and the semiconductor 406c are not necessarily simple ratios of integers.

As the semiconductor 406, an oxide having an electron affinity higher than those of the semiconductors 406a and 406c is used. For example, as the semiconductor 406, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406 having the highest electron affinity in the semiconductors 406a, 406, and 406c.

Here, in some cases, there is a mixed region of the semiconductor 406a and the semiconductor 406 between the semiconductor 406a and the semiconductor 406. Furthermore, in some cases, there is a mixed region of the semiconductor 406 and the semiconductor 406c between the semiconductor 406 and the semiconductor 406c. The mixed region has a low density of defect states. For that reason, the stack including the semiconductor 406a, the semiconductor 406, and the semiconductor 406c has a band diagram where energy is changed continuously at each interface and in the vicinity of the interface (continuous junction) (see FIG. 10E). Note that boundaries of the semiconductor 406a, the semiconductor 406, and the semiconductor 406c are not clear in some cases.

At this time, electrons move mainly in the semiconductor 406, not in the semiconductor 406a and the semiconductor 406c. As described above, when the density of defect states at the interface between the semiconductor 406a and the semiconductor 406 and the density of defect states at the interface between the semiconductor 406 and the semiconductor 406c are decreased, electron movement in the semiconductor 406 is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 µm×1 µm of a top surface or a bottom surface of the semiconductor 406 (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 µm×1 µm is less than 1 nm, preferably less than 0.6 nm, further preferably less than 0.5 nm, still further preferably less than 0.4 nm. The maximum difference (P–V) with the measurement area of 1 µm×1 µm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 406 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 406, the on-state current of the transistor can be increased in some cases.

Furthermore, in the case where the density of defect states is high in a region where a channel is formed, electrical characteristics of the transistor vary in some cases. For example, in the case where the defect states serve as carrier generation sources, the threshold voltage of the transistor might vary.

To decrease oxygen vacancies in the semiconductor 406, for example, there is a method in which excess oxygen in the insulator 402 is moved to the semiconductor 406 through the semiconductor 406a. In this case, the semiconductor 406a is preferably a layer having an oxygen-transmitting property (a layer through which oxygen passes or is transmitted).

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406 where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406 in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406c.

The semiconductor 406 includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406. The semiconductor 406a and the semiconductor 406c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. Furthermore, the semiconductor 406 includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406. The semiconductor 406a and the semiconductor 406c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406, and the semiconductor 406c is provided at two or more of the following positions: over the semiconductor 406a, under the semiconductor 406a, over the semiconductor 406c, and under the semiconductor 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., an SOI substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406 is an oxide semiconductor, the insulator 402 can have a function of supplying oxygen to the semiconductor 406.

Each of the conductor 416a and the conductor 416b may be formed to have a single-layer structure or a stacked-layer structure using a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 11A:
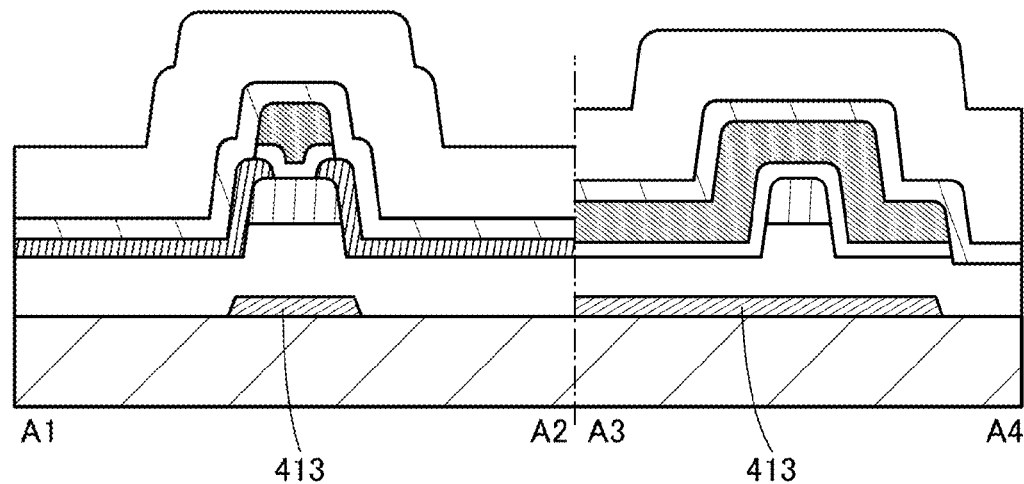
FIGS. 11A and 11B are cross-sectional views each illustrating a transistor of one embodiment of the present invention.
Figure 11B:
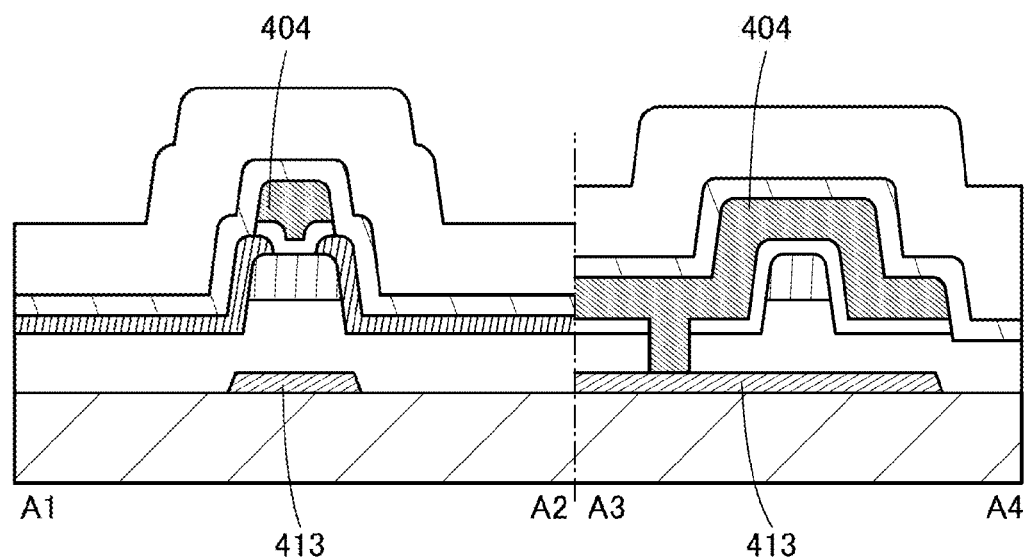

Note that the transistor structure of one embodiment of the present invention is not limited to the above. Furthermore, a conductor 413 may be provided in the transistor as illustrated in FIG. 11A, for example. The conductor 413 functions as a second gate electrode of the transistor. As illustrated in FIG. 11B, the conductor 404 may be electrically connected to the conductor 413. With such a structure, the conductor 404 and the conductor 413 are supplied with the same potential; thus, switching characteristics of the transistor can be improved. The transistor illustrated in FIGS. 11A and 11B corresponds to, for example, the transistor 102a illustrated in FIG. 2.

The conductor 413 may be formed to have a single-layer structure or a stacked-layer structure using a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 12A:
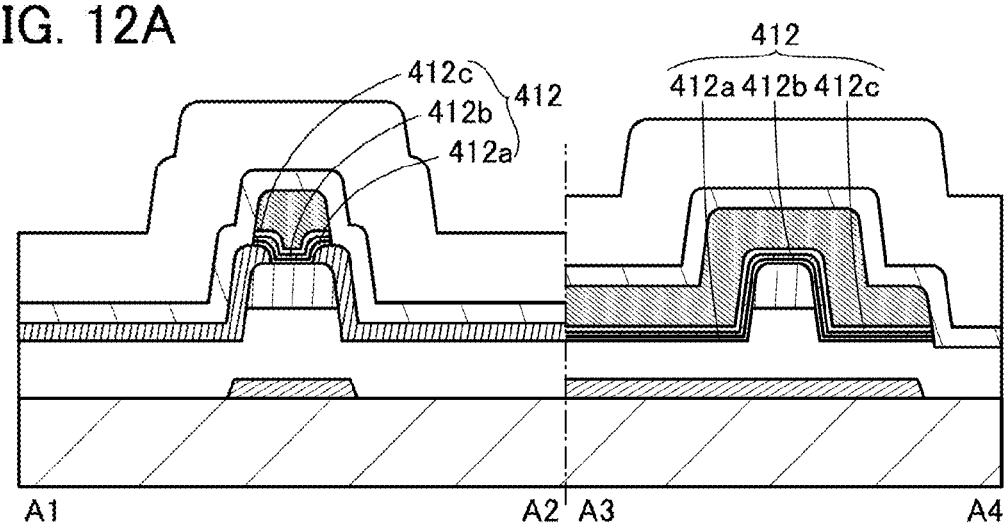
FIGS. 12A to 12C are cross-sectional views each illustrating a transistor of one embodiment of the present invention.

Alternatively, for example, the insulator 412 may include an insulator 412a, an insulator 412b, and an insulator 412c as illustrated in FIG. 12A. The insulator 412b preferably includes an electron trap region. The electron trap region has a function of trapping electrons. When the insulator 412a and the insulator 412c have a function of inhibiting release of electrons, the electrons trapped in the insulator 412b behave as if they are negative fixed charges. Thus, the insulator 412b has a function of a floating gate. The transistor illustrated in FIG. 12A corresponds to, for example, the transistor 102a illustrated in FIG. 3B. Note that in some cases, a conductor or a semiconductor may be used instead of the insulator 412b. However, when the insulator 412b is used, release of trapped electrons can be inhibited in some cases.

For the insulator 412a and the insulator 412c, description of the insulator 412 is to be referred to. As the insulator 412b, an oxide or a nitride containing boron, aluminum, silicon, scandium, titanium, gallium, yttrium, zirconium, indium, lanthanum, cerium, neodymium, hafnium, or thallium is used. Preferably, hafnium oxide is used.

Figure 12B:
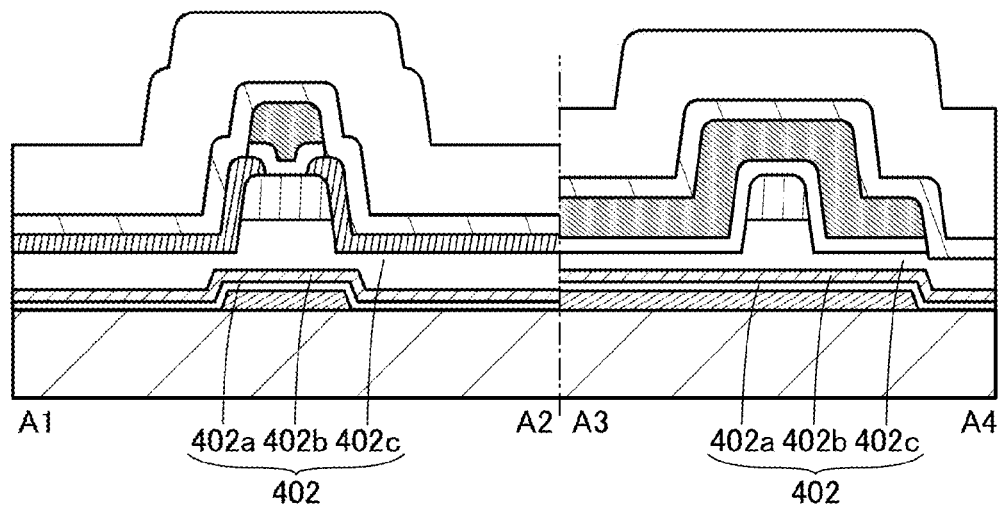

Alternatively, for example, the insulator 402 may include an insulator 402a, an insulator 402b, and an insulator 402c as illustrated in FIG. 12B. The insulator 402b preferably includes an electron trap region. When the insulator 402a and the insulator 402c have a function of inhibiting release of electrons, the electrons trapped in the insulator 402b behave as if they are negative fixed charges. Thus, the insulator 402b has a function of a floating gate. The transistor illustrated in FIG. 12B corresponds to, for example, the transistor 102a illustrated in FIG. 3C. Note that in some cases, a conductor or a semiconductor may be used instead of the insulator 402b. However, when the insulator 402b is used, release of trapped electrons can be inhibited in some cases.

For the insulator 402a and the insulator 402c, description of the insulator 402 is to be referred to. As the insulator 402b, an oxide or a nitride containing boron, aluminum, silicon, scandium, titanium, gallium, yttrium, zirconium, indium, lanthanum, cerium, neodymium, hafnium, or thallium is used. Preferably, hafnium oxide is used.

Figure 12C:
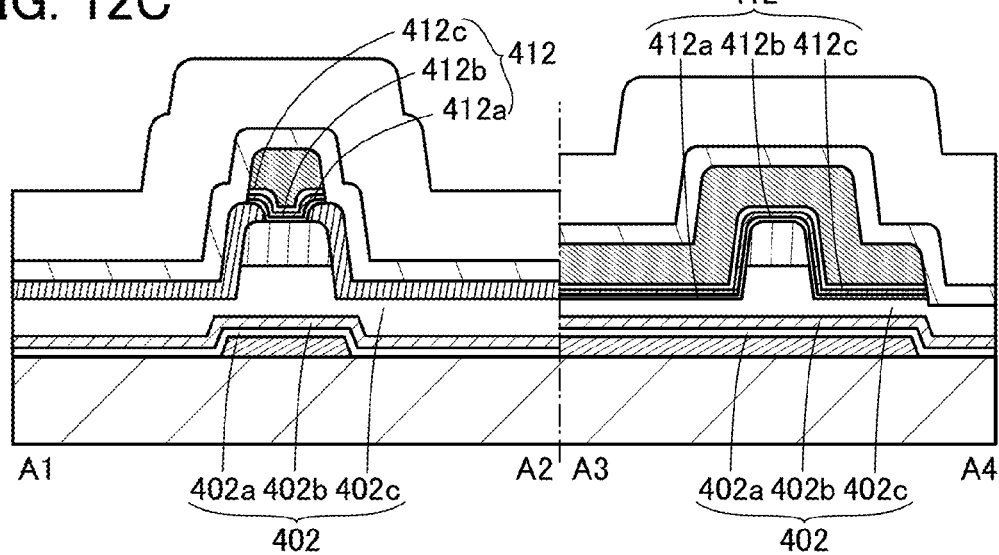

Alternatively, for example, the insulator 402 may include an insulator 402a, an insulator 402b, and an insulator 402c, and the insulator 412 may include the insulator 412a, the insulator 412b, and the insulator 412c as illustrated in FIG. 12C. The transistor illustrated in FIG. 12C corresponds to, for example, the transistor 102a illustrated in FIG. 3D.

Figure 13A:
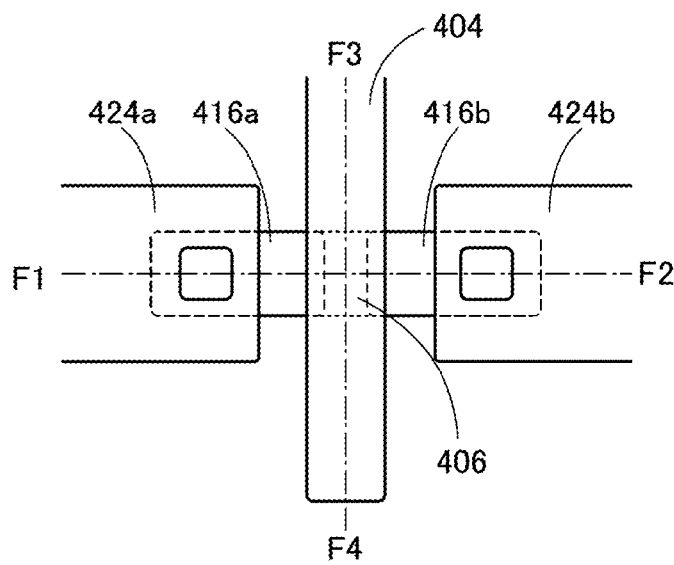
FIGS. 13A and 13B are a plan view and a cross-sectional view illustrating a transistor of one embodiment of the present invention.
Figure 13B:
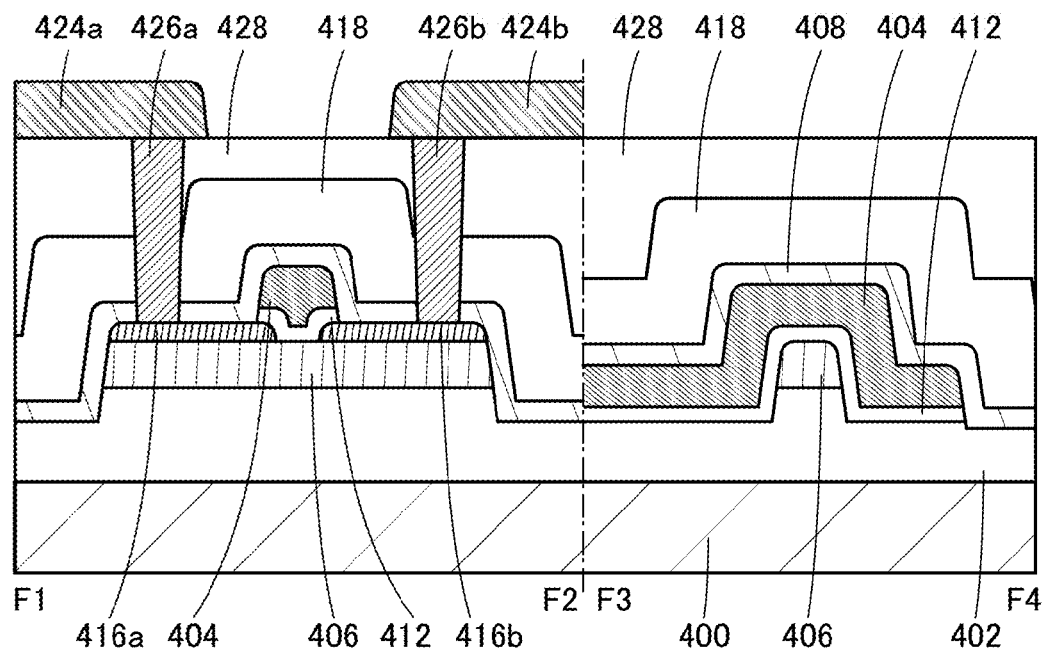

FIG. 13A is an example of a plan view of a transistor. FIG. 13B is an example of a cross-sectional view taken along dashed-dotted line F1-F2 and dashed-dotted line F3-F4 in FIG. 13A. Note that some components such as an insulator are omitted in FIG. 13A for easy understanding.

Although FIGS. 9A and 9B and the like show an example where the conductor 416a and the conductor 416b which function as the source electrode and the drain electrode are in contact with a top surface and a side surface of the semiconductor 406, a top surface of the insulator 402, and the like, a transistor structure of one embodiment of the present invention is not limited thereto. For example, as illustrated in FIGS. 13A and 13B, the conductor 416a and the conductor 416b may be in contact with only the top surface of the semiconductor 406.

As illustrated in FIG. 13B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin eliminates the need for planarization treatment performed on the top surface of the insulator 428 in some cases. By using a resin, a thick film can be formed in a short time; thus, the productivity can be increased.

As illustrated in FIGS. 13A and 13B, a conductor 424a and a conductor 424b may be provided over the insulator 428. The conductor 424a and the conductor 424b may function as wirings, for example. The insulator 428 may include an opening and the conductor 416a and the conductor 424a may be electrically connected to each other through the opening. The insulator 428 may have another opening and the conductor 416b and the conductor 424b may be electrically connected to each other through the opening. In this case, a conductor 426a and a conductor 426b may be provided in the respective openings.

Each of the conductors 424a and 424b may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 13A and 13B, the conductor 416a and the conductor 416b are not in contact with a side surface of the semiconductor 406. Thus, an electric field applied from the conductor 404 functioning as the gate electrode to the side surface of the semiconductor 406 is less likely to be blocked by the conductors 416a and 416b and the like. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406. In other words, the transistor having the structure illustrated in FIGS. 13A and 13B has excellent electrical characteristics such as a high on-state current, high field-effect mobility, a small subthreshold swing value, and high reliability.

Figure 14A:
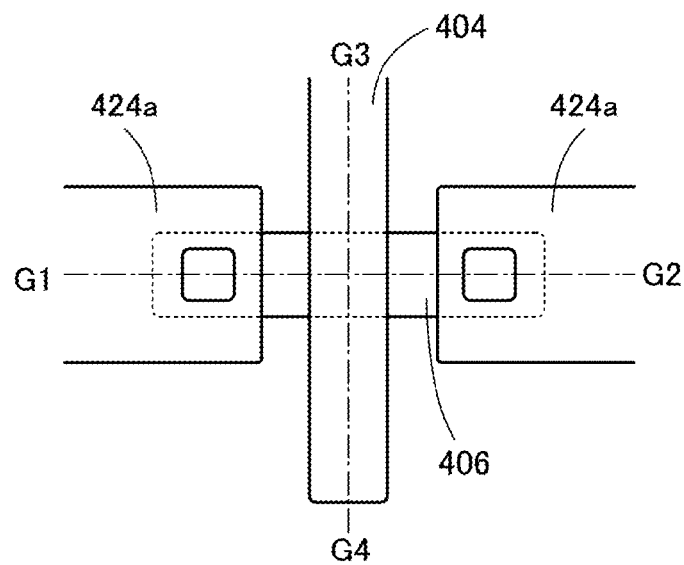
FIGS. 14A and 14B are a plan view and a cross-sectional view illustrating a transistor of one embodiment of the present invention.
Figure 14B:
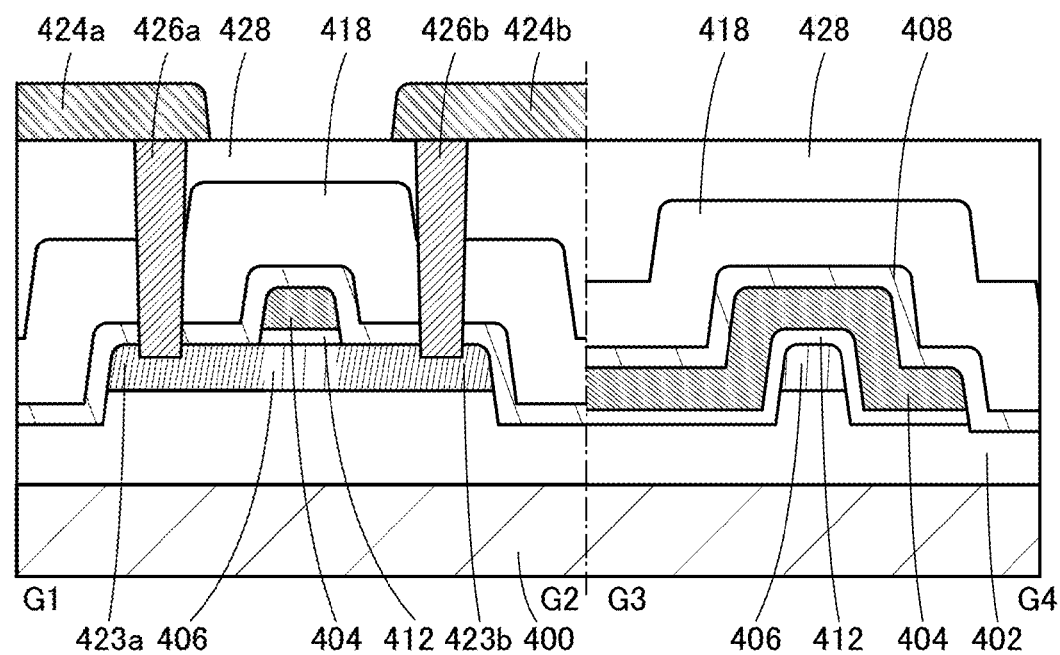

FIG. 14A is an example of a plan view of a transistor. FIG. 14B is an example of a cross-sectional view taken along dashed-dotted line G1-G2 and dashed-dotted line G3-G4 in FIG. 14A. Note that some components such as an insulator are omitted in FIG. 14A for easy understanding.

The transistor may have a structure in which, as illustrated in FIGS. 14A and 14B, the conductor 416a and the conductor 416b are not provided and the conductor 426a and the conductor 426b are in contact with the semiconductor 406. In this case, a low-resistance region 423a (a low-resistance region 423b) is preferably provided in a region in contact with at least the conductor 426a and the conductor 426b in the semiconductor 406. The low-resistance region 423a and the low-resistance region 423b may be formed in such a manner that, for example, the conductor 404 and the like are used as masks and impurities are added to the semiconductor 406. The conductor 426a and the conductor 426b may be provided in holes (portions which penetrate) or recessed portions (portions which do not penetrate) of the semiconductor 406. When the conductor 426a and the conductor 426b are provided in holes or recessed portions of the semiconductor 406, contact areas between the conductors 426a and 426b and the semiconductor 406 are increased; thus, the adverse effect of the contact resistance can be decreased. In other words, the on-state current of the transistor can be increased.

Figure 15A:
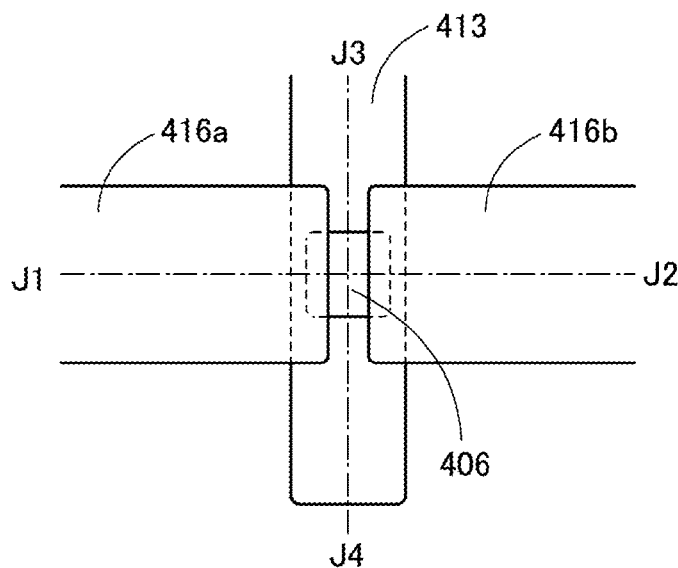
FIGS. 15A and 15B are a plan view and a cross-sectional view illustrating a transistor of one embodiment of the present invention.
Figure 15B:
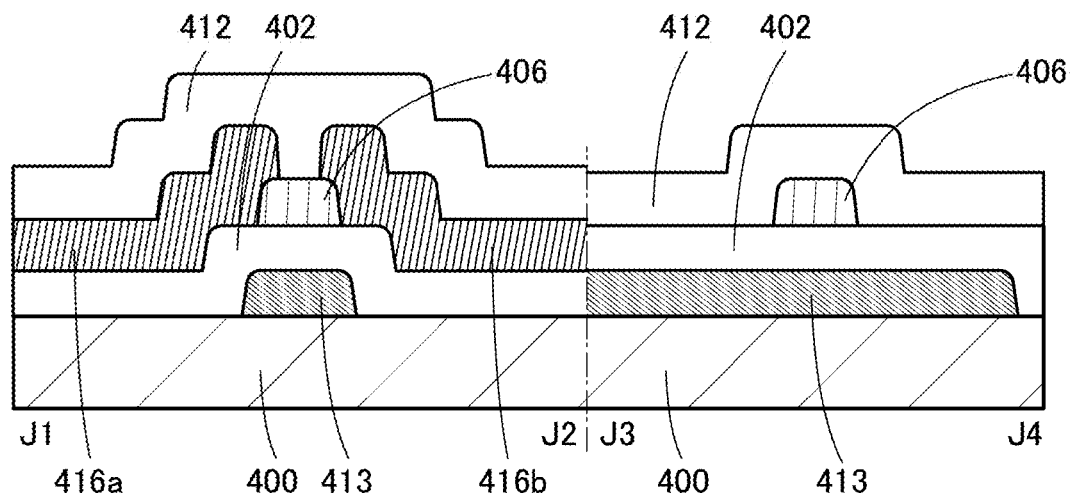

FIG. 15A is an example of a plan view of a transistor. FIG. 15B is an example of a cross-sectional view taken along dashed-dotted line J1-J2 and dashed-dotted line J3-J4 in FIG. 15A. Note that some components such as an insulator are omitted in FIG. 15A for easy understanding.

The transistor in FIGS. 15A and 15B includes a conductor 413 over a substrate 400, an insulator 402 over the conductor 413, a semiconductor 406 over the insulator 402, a conductor 416a and a conductor 416b which are in contact with the semiconductor 406 and arranged to be apart from each other, and an insulator 412 over the semiconductor 406, the conductor 416a, and the conductor 416b. The conductor 413 faces a bottom surface of the semiconductor 406 with the insulator 402 provided therebetween. The insulator 402 may have a projection. An insulator may be provided between the substrate 400 and the conductor 413. For the insulator, the description of the above-described insulator 402 or the insulator 408 is referred to. The insulator 412 is not necessarily provided.

The insulator 412 is preferably an insulator containing excess oxygen.

Over the insulator 412, a display element may be provided. For example, a pixel electrode, a liquid crystal layer, a common electrode, a light-emitting layer, an organic EL layer, an anode, a cathode, or the like may be provided. The display element is connected to the conductor 416a or the like, for example.

Figure 16A:
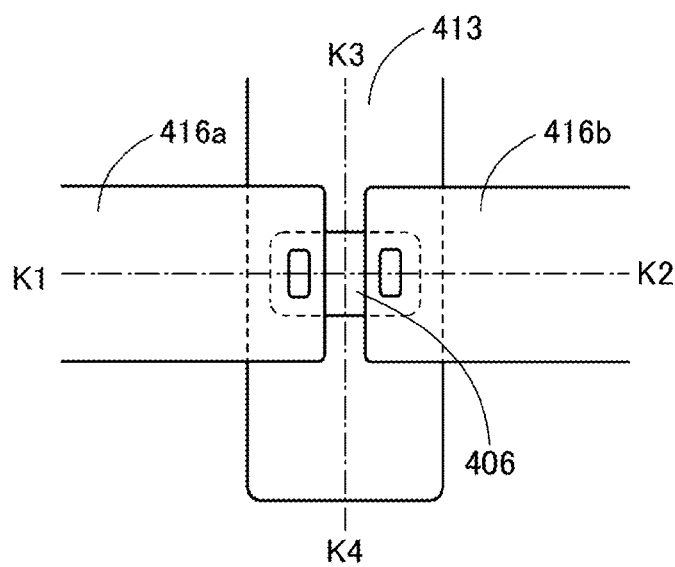
FIGS. 16A and 16B are a plan view and a cross-sectional view illustrating a transistor of one embodiment of the present invention.
Figure 16B:
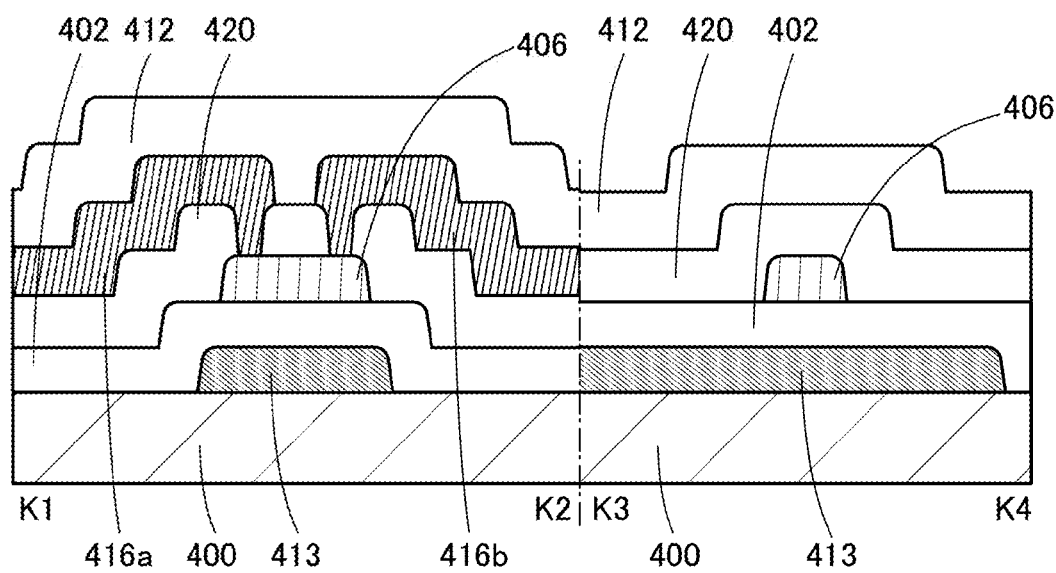

FIG. 16A is an example of a plan view of a transistor. FIG. 16B is an example of a cross-sectional view taken along dashed-dotted line K1-K2 and dashed-dotted line K3-K4 in FIG. 16A. Note that some components such as an insulator are omitted in FIG. 16A for easy understanding.

Over the semiconductor, an insulator that can function as a channel protective film may be provided. For example, as illustrated in FIGS. 16A and 16B, an insulator 420 may be provided between the semiconductor 406 and the conductors 416a and 416b. In that case, the conductor 416a (conductor 416b) and the semiconductor 406 are connected to each other through an opening in the insulator 420. For the insulator 420, the description of the insulator 418 may be referred to.

<Method for Injecting Electron>

A method for injecting electrons into the insulator 412b is described below.

Figure 17A:
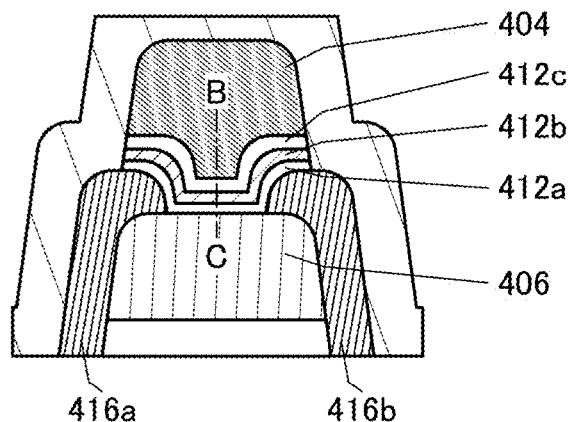
FIGS. 17A to 17C are a cross-sectional view and band diagrams of a transistor of one embodiment of the present invention.
Figure 17B:
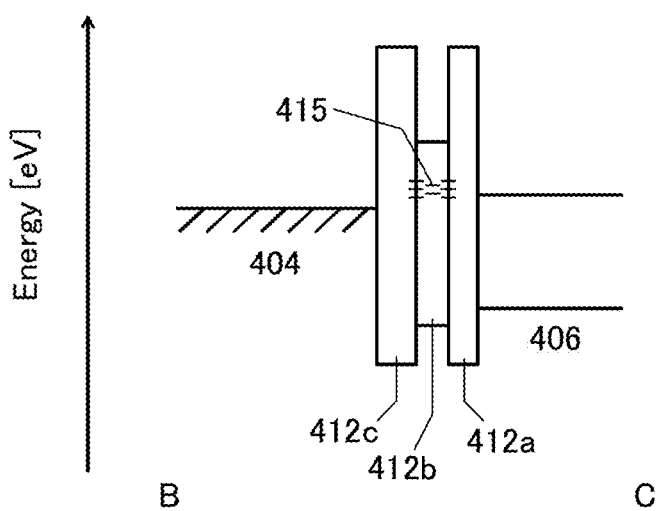
Figure 17C:
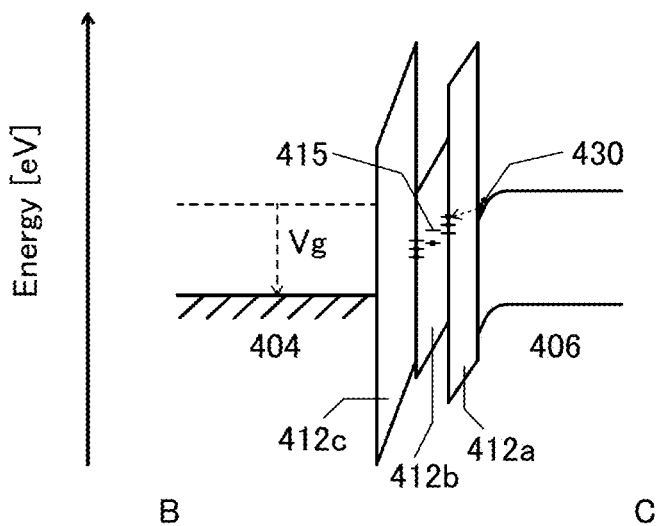

FIG. 17A is an enlarged view of the transistor illustrated in FIG. 12A. FIGS. 17B and 17C are band diagrams taken along dashed-dotted line B-C in FIG. 17A.

As shown in FIG. 17B, the insulator 412b has defect states 415 in itself, at the interface between the insulator 412a and the insulator 412b, and at the interface between the insulator 412b and the insulator 412c. Some of the defect states 415 serve as electron traps.

In FIG. 17B, since no voltage is applied to the conductor 404, electrons are hardly trapped in the defect states 415. As illustrated in FIG. 17C, by application of positive voltage Vg to the conductor 404, for example, electrons can be injected into some of the defect states 415. More specifically, when the positive voltage Vg is applied to the conductor 404 with voltage applied between the conductor 416a and the conductor 416b of the transistor, the band of the semiconductor 406 is curved and electrons 430 are induced at the interface between the semiconductor 406 and the insulator 412a (i.e., a channel is formed). The induced electrons 430 are accelerated by an electric field applied to the semiconductor 406, and some of them pass through a barrier of the insulator 412a in some cases. Some of the electrons 430 that pass through the barrier can be injected into the defect states 415.

Note that for example, application of negative voltage to the conductor 404 also enables electron injection into some of the defect states 415, in some cases. Specifically, when negative voltage that allows FN (Fowler-Nordheim) tunneling current to flow in the insulator 412c is applied to the conductor 404, electrons can be injected from the conductor 404 into some of the defect states 415.

In the above method, relatively high voltage is necessary for injection of electrons into the defect states 415. The electrons injected into the defect states 415 are stable at the voltage needed for driving the transistor. Accordingly, the electrons injected into the defect states 415 are retained for a long time.

The above-described method can also be applied to the insulator 402b.

<Structure of Oxide Semiconductor>

A structure of an oxide semiconductor that can be used as the semiconductor 406 and the like is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 21A:
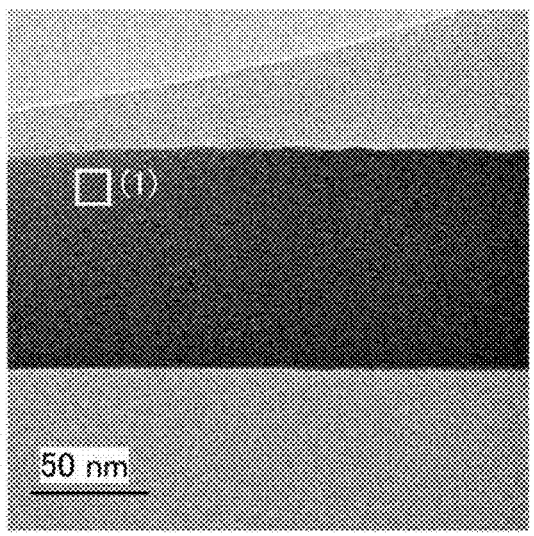
FIGS. 21A to 21C and FIG. 21D are Cs-corrected high-resolution TEM images of a cross section of a CAAC-OS and a schematic cross-sectional view of the CAAC-OS, respectively.

The CAAC-OS observed with a TEM is described below. FIG. 21A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 21B:
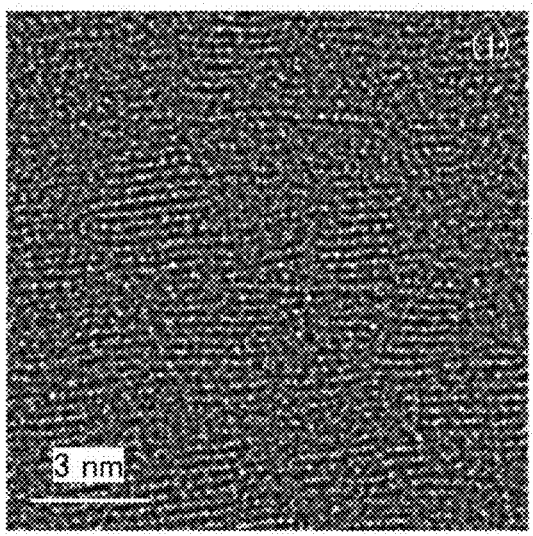

FIG. 21B is an enlarged Cs-corrected high-resolution TEM image of a region (1) in FIG. 21A. FIG. 21B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 21C:
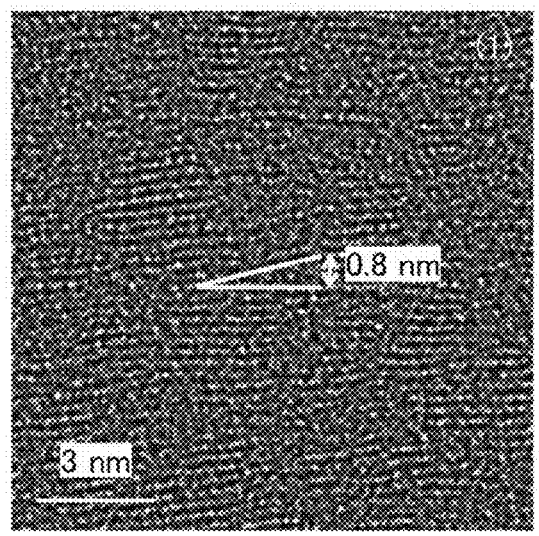

As shown in FIG. 21B, the CAAC-OS has a characteristic atomic arrangement. The characteristic atomic arrangement is denoted by an auxiliary line in FIG. 21C. FIGS. 21B and 21C prove that the size of a pellet is approximately 1 nm to 3 nm, and the size of a space caused by tilt of the pellets is approximately 0.8 nm. Therefore, the pellet can also be referred to as a nanocrystal (nc).

Figure 21D:
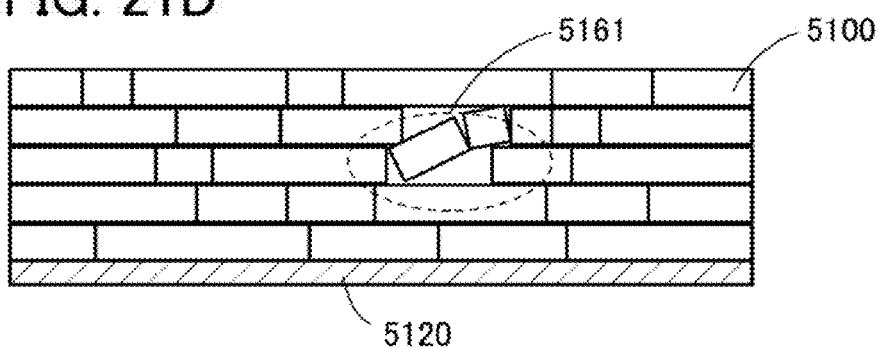

Here, according to the Cs-corrected high-resolution TEM images, the schematic arrangement of pellets 5100 of a CAAC-OS over a substrate 5120 is illustrated by such a structure in which bricks or blocks are stacked (see FIG. 21D). The part in which the pellets are tilted as observed in FIG. 21C corresponds to a region 5161 shown in FIG. 21D.

FIG. 22A shows a Cs-corrected high-resolution TEM image of a plane of the CAAC-OS observed from a direction substantially perpendicular to the sample surface. FIGS. 22B, 22C, and 22D are enlarged Cs-corrected high-resolution TEM images of regions (1), (2), and (3) in FIG. 22A, respectively. FIGS. 22B, 22C, and 22D indicate that metal atoms are arranged in a triangular, quadrangular, or hexagonal configuration in a pellet. However, there is no regularity of arrangement of metal atoms between different pellets.

Figure 23A:
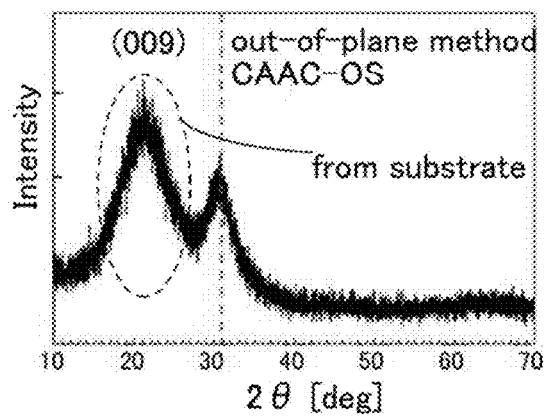
FIGS. 23A to 23C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 23B:
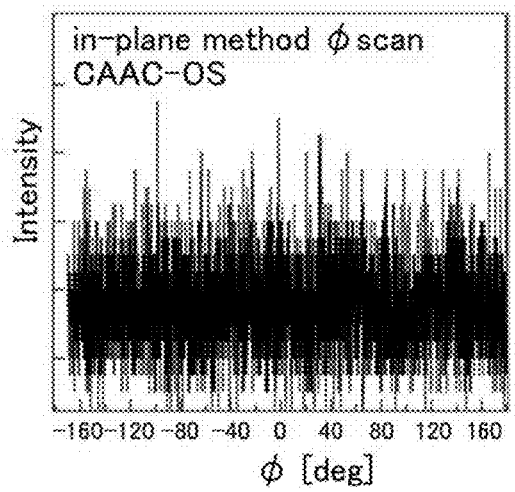
Figure 23C:
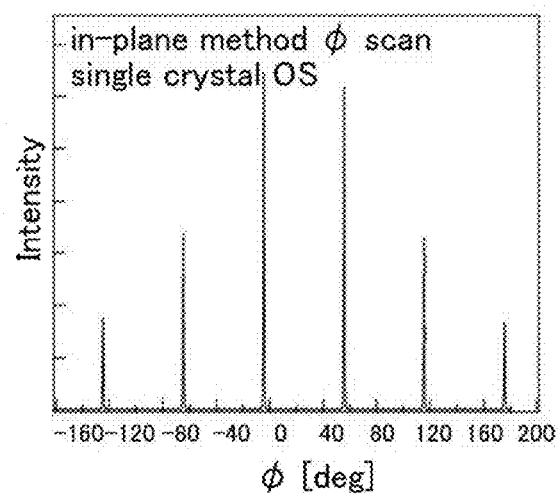

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector to the sample surface as an axis (φ axis), as shown in FIG. 23B, a peak is not clearly observed. In contrast, in the case of a single crystal oxide semiconductor of $InGaZnO_4$, when φ scan is performed with 2θ fixed at around 56°, as shown in FIG. 23C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 24A can be obtained. In this diffraction pattern, spots derived from the (009) plane of an $InGaZnO4$ crystal are included.

Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 24B shows a diffraction pattern obtained in such a manner that an electron beam with a probe diameter of 300 nm is incident on the same sample in a direction perpendicular to the sample surface. As shown in FIG. 24B, a ring-like diffraction pattern is observed. Thus, the electron diffraction also indicates that the a-axes and b-axes of the pellets included in the CAAC-OS do not have regular alignment. The first ring in FIG. 24B is considered to be derived from the (010) plane, the (100) plane, and the like of the InGaZnO$_4$ crystal. Furthermore, it is supposed that the second ring in FIG. 24B is derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.
<Microcrystalline Oxide Semiconductor>

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including randomly aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.
<Amorphous Oxide Semiconductor>

Next, an amorphous oxide semiconductor is described.

The amorphous oxide semiconductor is an oxide semiconductor having disordered atomic arrangement and no crystal part. An example of the amorphous oxide semiconductor is an oxide semiconductor with a non-crystalline state like quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 25:
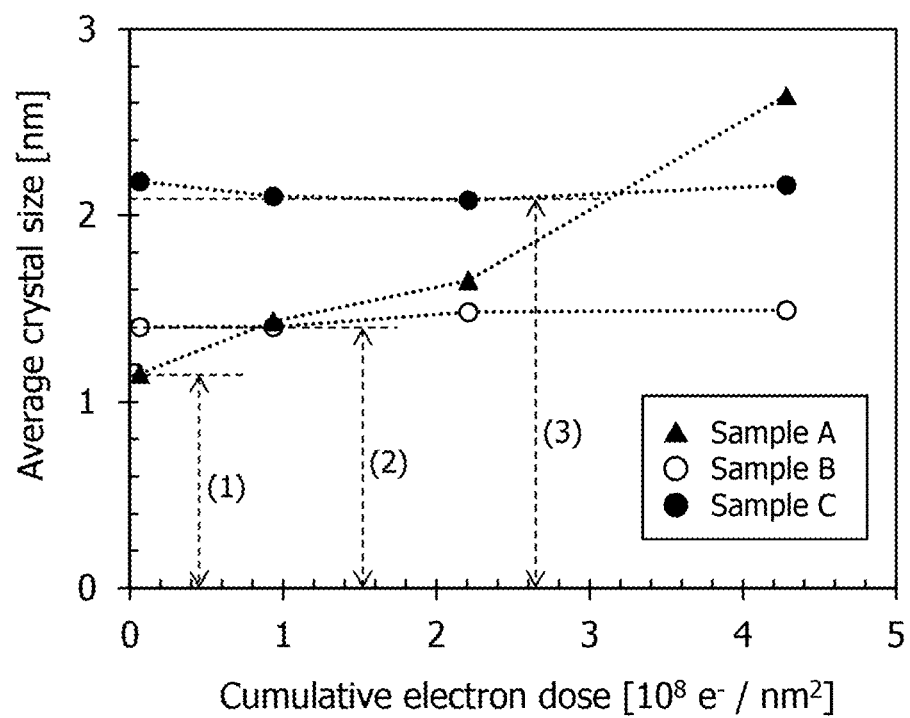
FIG. 25 shows a change of crystal parts of an In—Ga—Zn oxide owing to electron irradiation.

FIG. 25 shows change in the average size of crystal parts (at 22 points to 45 points) in each sample. Note that the crystal part size corresponds to the length of a lattice fringe. FIG. 25 indicates that the crystal part size in the a-like OS increases with an increase in the cumulative electron dose. Specifically, as shown by (1) in FIG. 25, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 25, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at a desired ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<CPU>

A CPU including a semiconductor device such as any of the above-described transistors or the above-described memory device is described below.

Figure 18:
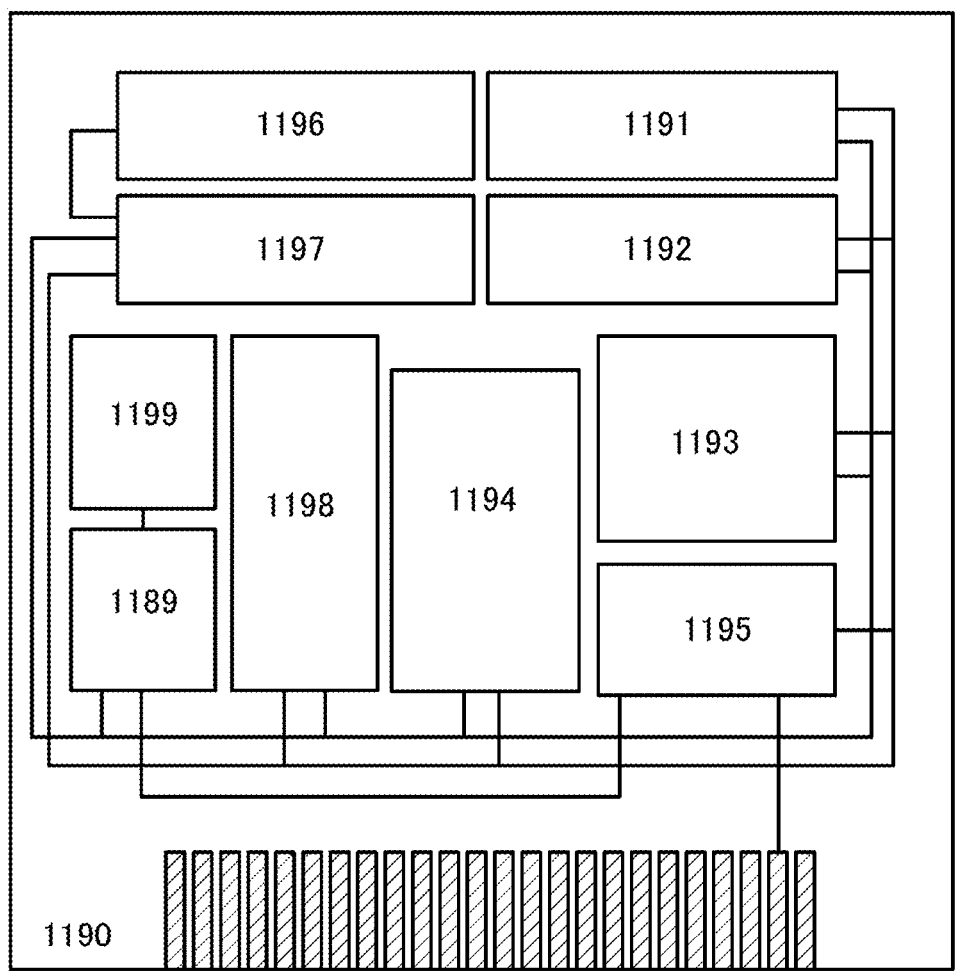
FIG. 18 is a block diagram of a semiconductor device of one embodiment of the present invention.

FIG. 18 is a block diagram illustrating a configuration example of a CPU including any of the above-described transistors as a component.

The CPU illustrated in FIG. 18 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 18 is just an example in which the configuration has been simplified, and an actual CPU may have a variety of configurations depending on the application. For example, the CPU may have the following configuration: a structure including the CPU illustrated in FIG. 18 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 18, a memory cell is provided in the register 1196. For the memory cell of the register 1196, any of the above-described transistors, the above-described memory device, or the like can be used.

In the CPU illustrated in FIG. 18, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 19:
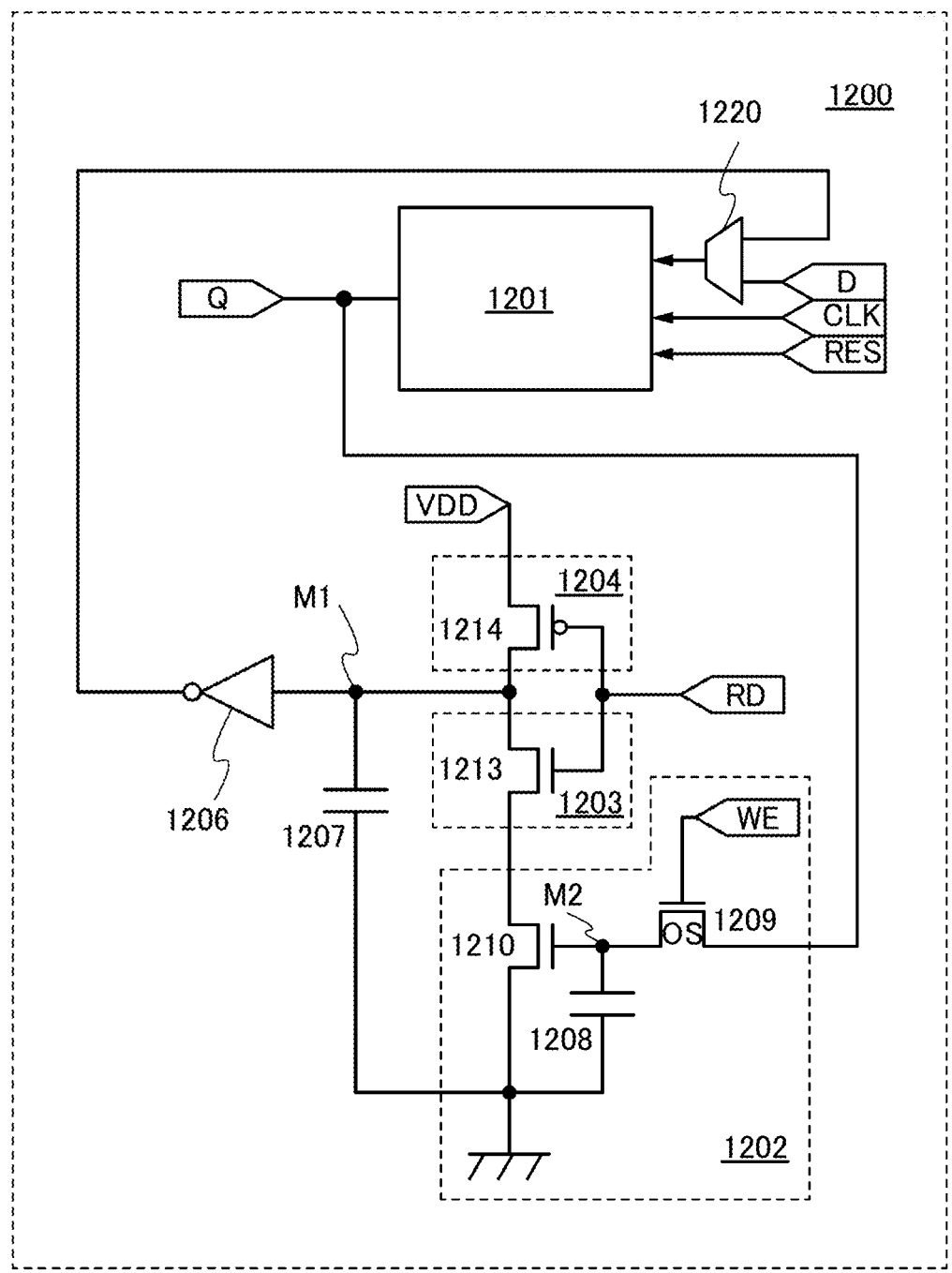
FIG. 19 is a circuit diagram of a semiconductor device of one embodiment of the present invention.

FIG. 19 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 19 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 19, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 19, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 19, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the transistor 1210 is brought into the on state or the off state depending on the signal retained by the capacitor 1208, and a signal corresponding to the state can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Electronic Device>

The semiconductor device of one embodiment of the present invention can be used for display devices, personal computers, or image reproducing devices provided with recording media (typically, devices which reproduce the content of recording media such as digital versatile discs (DVD) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 20A to 20F illustrate specific examples of these electronic devices.

Figure 20A:
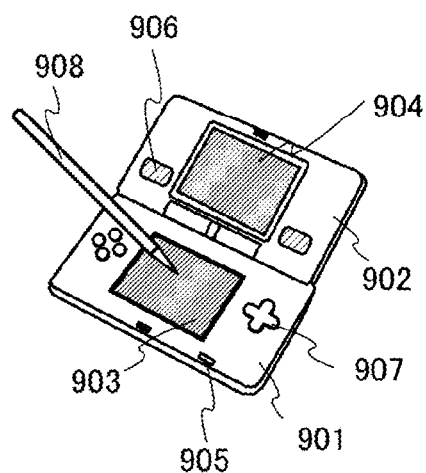
FIGS. 20A to 20F are perspective views each illustrating an electronic device of one embodiment of the present invention.

FIG. 20A illustrates a portable game console including a housing 901, a housing 902, a display portion 903, a display portion 904, a microphone 905, a speaker 906, an operation key 907, a stylus 908, and the like. Although the portable game console in FIG. 20A has the two display portions 903 and 904, the number of display portions included in a portable game console is not limited to this.

Figure 20B:
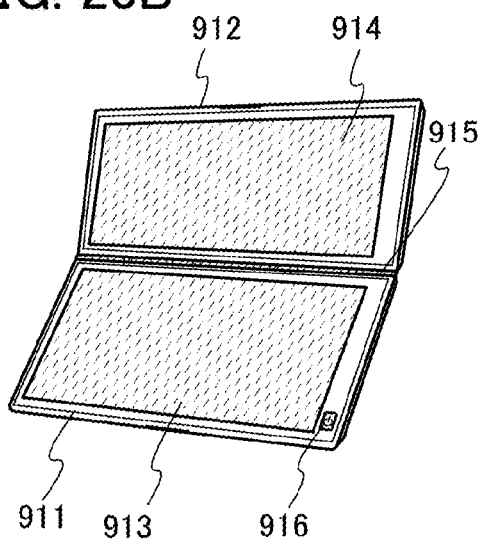

FIG. 20B illustrates a portable data terminal including a housing 911, a housing 912, a display portion 913, a display portion 914, a joint 915, an operation key 916, and the like. The display portion 913 is provided in the housing 911, and the display portion 914 is provided in the housing 912. The housing 911 and the housing 912 are connected to each other with the joint 915, and the angle between the housing 911 and the housing 912 can be changed with the joint 915. An image on the display portion 913 may be switched in accordance with the angle at the joint 915 between the housing 911 and the housing 912. A display device with a position input function may be used as at least one of the display portion 913 and the display portion 914. Note that the position input function can be added by providing a touch panel in a display device. Alternatively, the position input function can be added by providing a photoelectric conversion element called a photosensor in a pixel portion of a display device.

Figure 20C:
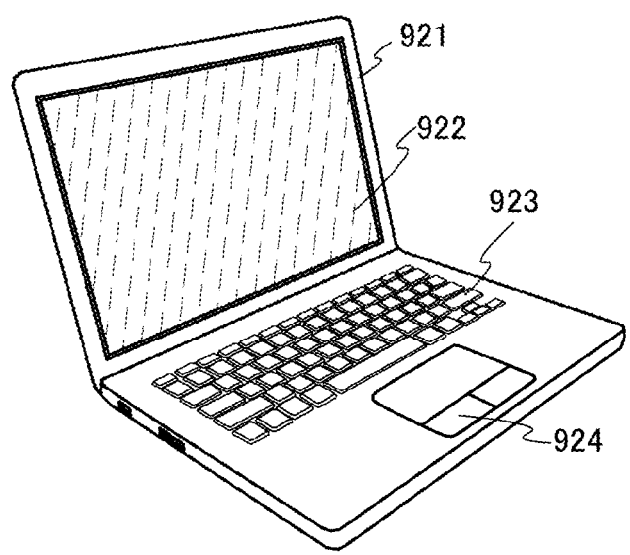

FIG. 20C illustrates a laptop personal computer, which includes a housing 921, a display portion 922, a keyboard 923, a pointing device 924, and the like.

Figure 20D:
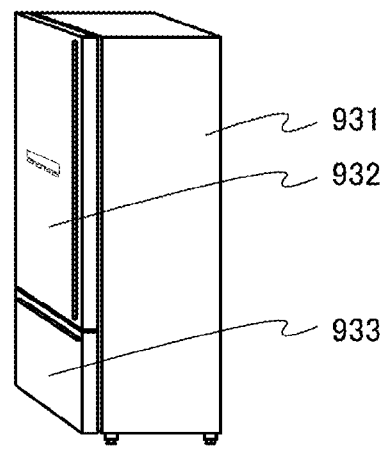

FIG. 20D illustrates an electric refrigerator-freezer, which includes a housing 931, a door for a refrigerator 932, a door for a freezer 933, and the like.

Figure 20E:
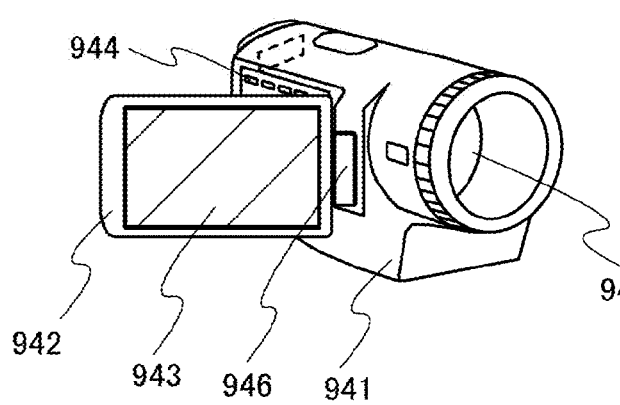

FIG. 20E illustrates a video camera, which includes a housing 941, a housing 942, a display portion 943, operation keys 944, a lens 945, a joint 946, and the like. The operation keys 944 and the lens 945 are provided for the housing 941, and the display portion 943 is provided for the housing 942. The housing 941 and the housing 942 are connected to each other with the joint 946, and the angle between the housing 941 and the housing 942 can be changed with the joint 946. Images displayed on the display portion 943 may be switched in accordance with the angle at the joint 946 between the housing 941 and the housing 942.

Figure 20F:
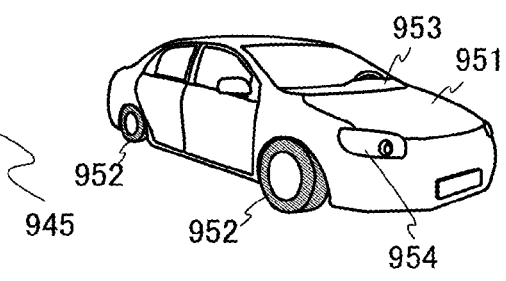

FIG. 20F illustrates a car including a car body 951, wheels 952, a dashboard 953, lights 954, and the like.

This application is based on Japanese Patent Application serial no. 2014-179836 filed with Japan Patent Office on Sep. 4, 2014, the entire contents of which are hereby incorporated by reference.

What is claimed is:

1. A semiconductor device comprising:
a first circuit;
a second circuit; and
a third circuit,
wherein the first circuit comprises a first transistor, a first capacitor, and a first wiring,
wherein the first transistor comprises a first conductor and a first oxide semiconductor,
wherein the first conductor comprises a region in contact with the first oxide semiconductor,
wherein one terminal of the first capacitor is electrically connected to the first conductor,
wherein the other terminal of the first capacitor is electrically connected to the first wiring,
wherein the second circuit comprises a second transistor, a second capacitor, and a second wiring,
wherein the second transistor comprises a second conductor and a second oxide semiconductor,
wherein the second conductor comprises a region in contact with the second oxide semiconductor,
wherein one terminal of the second capacitor is electrically connected to the second conductor,
wherein the other terminal of the second capacitor is electrically connected to the second wiring,
wherein the third circuit comprises a third transistor,
wherein the third transistor comprises a third conductor, a third oxide semiconductor, a first insulator, a second insulator, and a third insulator,
wherein the third conductor and the third oxide semiconductor overlap with each other,
wherein the first insulator is positioned between the third conductor and the third oxide semiconductor,
wherein the second insulator is positioned between the third conductor and the first insulator,
wherein the third insulator is positioned between the third conductor and the second insulator,
wherein the second insulator comprises an electron trap region,
wherein a gate voltage at which a drain current in a subthreshold region is $1 \times 10^{-12}$ A is greater than or equal to 0.8 V and less than or equal to 1.5 V in the first transistor, and
wherein a gate voltage at which a drain current in a subthreshold region is $1 \times 10^{-12}$ A is greater than or equal to 0 V and less than or equal to 0.7 V in the second transistor.

2. The semiconductor device according to claim 1,
wherein the second insulator is an oxide or a nitride containing boron, aluminum, silicon, scandium, titanium, gallium, yttrium, zirconium, indium, lanthanum, cerium, neodymium, hafnium, or thallium.

3. The semiconductor device according to claim 1,
wherein the first transistor further comprises a fourth conductor, a fourth insulator, a fifth insulator, and a sixth insulator,
wherein the fourth conductor and the first oxide semiconductor overlap with each other,
wherein the fourth insulator is positioned between the fourth conductor and the first oxide semiconductor,
wherein the fifth insulator is positioned between the fourth conductor and the fourth insulator,
wherein the sixth insulator is positioned between the fourth conductor and the fifth insulator, and
wherein the fifth insulator comprises a negatively charged region.

4. The semiconductor device according to claim 3,
wherein the fifth insulator is an oxide or a nitride containing boron, aluminum, silicon, scandium, titanium, gallium, yttrium, zirconium, indium, lanthanum, cerium, neodymium, hafnium, or thallium.

5. The semiconductor device according to claim 1,
wherein the second transistor further comprises a fifth conductor, a seventh insulator, an eighth insulator, and a ninth insulator,
wherein the fifth conductor and the second oxide semiconductor overlap with each other,
wherein the seventh insulator is positioned between the fifth conductor and the second oxide semiconductor,
wherein the eighth insulator is positioned between the fifth conductor and the seventh insulator,
wherein the ninth insulator is positioned between the fifth conductor and the eighth insulator, and
wherein the eighth insulator comprises a negatively charged region.

6. The semiconductor device according to claim 5,
wherein the eighth insulator is an oxide or a nitride containing boron, aluminum, silicon, scandium, titanium, gallium, yttrium, zirconium, indium, lanthanum, cerium, neodymium, hafnium, or thallium.

7. The semiconductor device according to claim 3,
wherein the first transistor further comprises a sixth conductor and a ninth insulator,
wherein the sixth conductor and the first oxide semiconductor overlap with each other, and
wherein the ninth insulator is positioned between the sixth conductor and the first oxide semiconductor.

8. The semiconductor device according to claim 7,
wherein the first transistor further comprises a tenth insulator and an eleventh insulator,
wherein the tenth insulator is positioned between the sixth conductor and the ninth insulator,
wherein the eleventh insulator is positioned between the sixth conductor and the tenth insulator, and wherein the tenth insulator comprises a negatively charged region.

9. The semiconductor device according to claim 8,
wherein the tenth insulator is an oxide or a nitride containing boron, aluminum, silicon, scandium, titanium, gallium, yttrium, zirconium, indium, lanthanum, cerium, neodymium, hafnium, or thallium.

10. The semiconductor device according to claim 5,
wherein the second transistor further comprises an seventh conductor and a twelfth insulator,
wherein the seventh conductor and the second oxide semiconductor overlap with each other, and
wherein the twelfth insulator is positioned between the seventh conductor and the second oxide semiconductor.

11. The semiconductor device according to claim 10,
wherein the second transistor further comprises a thirteenth insulator and a fourteenth insulator,
wherein the thirteenth insulator is positioned between the seventh conductor and the twelfth insulator,
wherein the fourteenth insulator is positioned between the seventh conductor and the thirteenth insulator, and
wherein the thirteenth insulator comprises a negatively charged region.

12. The semiconductor device according to claim 11,
wherein the thirteenth insulator is an oxide or a nitride containing boron, aluminum, silicon, scandium, titanium, gallium, yttrium, zirconium, indium, lanthanum, cerium, neodymium, hafnium, or thallium.

13. The semiconductor device according to claim 1,
wherein the third transistor further comprises a eighth conductor and a fifteenth insulator,
wherein the eighth conductor and the third oxide semiconductor overlap with each other, and
wherein the fifteenth insulator is positioned between the eighth conductor and the third oxide semiconductor.

14. The semiconductor device according to claim 13,
wherein the third transistor further comprises a sixteenth insulator and a seventeenth insulator,
wherein the sixteenth insulator is positioned between the eighth conductor and the fifteenth insulator,
wherein the seventeenth insulator is positioned between the eighth conductor and the sixteenth insulator, and
wherein the sixteenth insulator comprises a negatively charged region.

15. The semiconductor device according to claim 14,
wherein the sixteenth insulator is an oxide or a nitride containing boron, aluminum, silicon, scandium, titanium, gallium, yttrium, zirconium, indium, lanthanum, cerium, neodymium, hafnium, or thallium.

16. The semiconductor device according to claim 1,
wherein the first circuit further comprises a fourth transistor,
wherein the fourth transistor comprises a first semiconductor, a ninth conductor, and an eighteenth insulator,
wherein the ninth conductor comprises a region in which the ninth conductor and the first semiconductor overlap with each other,
wherein the eighteenth insulator is positioned between the ninth conductor and the first semiconductor, and
wherein the ninth conductor is electrically connected to the first conductor.

17. The semiconductor device according to claim 16,
wherein the fourth transistor comprises a region in which the fourth transistor and the first transistor or the first capacitor overlap with each other.

18. The semiconductor device according to claim 1,
wherein the second circuit further comprises a fifth transistor,
wherein the fifth transistor comprises a second semiconductor, an tenth conductor, and a nineteenth insulator,
wherein the tenth conductor comprises a region in which the tenth conductor and the second semiconductor overlap with each other,
wherein the nineteenth insulator is positioned between the tenth conductor and the second semiconductor, and
wherein the tenth conductor is electrically connected to the second conductor.

19. The semiconductor device according to claim 18,
wherein the fifth transistor comprises a region in which the fifth transistor and the second transistor or the second capacitor overlap with each other.

20. The semiconductor device according to claim 1,
wherein the first oxide semiconductor, the second oxide semiconductor, and the third oxide semiconductor are positioned in the same layer.

* * * * *